United States Patent
Kanna

(10) Patent No.: US 12,426,166 B2
(45) Date of Patent: Sep. 23, 2025

(54) METHOD OF MANUFACTURING CONDUCTIVE PATTERN, TOUCH SENSOR, ELECTROMAGNETIC WAVE SHIELD, ANTENNA, WIRING BOARD, CONDUCTIVE HEATING ELEMENT, AND STRUCTURE

(71) Applicant: FUJIFILM Corporation, Tokyo (JP)

(72) Inventor: Shinichi Kanna, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 278 days.

(21) Appl. No.: 17/894,653

(22) Filed: Aug. 24, 2022

(65) Prior Publication Data
US 2023/0007784 A1 Jan. 5, 2023

Related U.S. Application Data

(63) Continuation of application No. PCT/JP2020/043871, filed on Nov. 25, 2020.

(30) Foreign Application Priority Data

Feb. 28, 2020 (JP) ................................. 2020-034129

(51) Int. Cl.
*H05K 3/24* (2006.01)
*G06F 3/041* (2006.01)
(Continued)

(52) U.S. Cl.
CPC ......... *H05K 3/241* (2013.01); *G06F 3/04164* (2019.05); *H05K 1/0218* (2013.01);
(Continued)

(58) Field of Classification Search
CPC ...... H05K 3/241; H05K 3/0079; H05K 3/022; H05K 3/0023; H05K 1/0218
See application file for complete search history.

(56) References Cited

U.S. PATENT DOCUMENTS 10,031,631 B2 * 7/2018 Kanna .................. C09D 123/06
10,174,181 B2 * 1/2019 Morozumi ............... C08K 9/04
(Continued)

FOREIGN PATENT DOCUMENTS

CN 102144189 A 8/2011
JP 2002076575 A * 3/2002
(Continued)

OTHER PUBLICATIONS

17894653_2025-02-27_JP_2002076575_A_H.pdf (Translation of JP 2002-076575-A) (Year: 2002).*
(Continued)

*Primary Examiner* — Jeffrey T Carley
(74) *Attorney, Agent, or Firm* — Sughrue Mion, PLLC

(57) ABSTRACT

The present disclosure provides a method of manufacturing a conductive pattern and applications thereof, the method including: a step of preparing a laminate including a transparent substrate, a light shielding pattern that is formed on the transparent substrate, and a negative tone photosensitive resin layer that is disposed on the transparent substrate and the light shielding pattern and is in contact with the transparent substrate; a step of irradiating a surface of the transparent substrate opposite to a surface facing the light shielding pattern with light; a step of developing the negative tone photosensitive resin layer to form a resin pattern in a region defined by the transparent substrate and the light shielding pattern; and a step of forming a conductive pattern on the light shielding pattern.

9 Claims, 2 Drawing Sheets

(51) Int. Cl.
  *H05K 1/02* (2006.01)
  *H05K 3/00* (2006.01)
  *H05K 3/02* (2006.01)
(52) U.S. Cl.
  CPC ........... *H05K 3/0079* (2013.01); *H05K 3/022* (2013.01); *G06F 2203/04103* (2013.01); *G06F 2203/04112* (2013.01); *H05K 2201/10098* (2013.01)

(56) References Cited

U.S. PATENT DOCUMENTS

| | | | | |
|---|---|---|---|---|
| 10,319,935 | B2* | 6/2019 | Nishimura | ........... H10K 59/124 |
| 10,336,043 | B2* | 7/2019 | Kanna | ..................... B32B 37/14 |
| 11,899,364 | B2* | 2/2024 | De | ......................... G03F 7/0387 |
| 2007/0095466 | A1 | 5/2007 | Tsuda | |
| 2011/0183267 | A1 | 7/2011 | Tsuda | |
| 2015/0345042 | A1 | 12/2015 | Yeh et al. | |
| 2018/0079864 | A1* | 3/2018 | Kawabata | ............. H01L 23/293 |
| 2018/0118887 | A1* | 5/2018 | Shibuya | ............. C08G 73/1042 |

FOREIGN PATENT DOCUMENTS

| | | | |
|---|---|---|---|
| JP | 2005-227501 A | 8/2005 | |
| JP | 2007-109902 A | 4/2007 | |
| JP | 2009-229499 A | 10/2009 | |
| JP | 2011-005768 A | 1/2011 | |
| JP | 2015-065376 A | 4/2015 | |
| JP | 2015-225650 A | 12/2015 | |
| TW | 202006045 A | 2/2020 | |
| WO | WO-2014196154 A1 * | 12/2014 | ............ G03F 7/027 |
| WO | 2016/017596 A1 | 2/2016 | |

OTHER PUBLICATIONS

17894653_2025-02-27_WO_2014196154_A1_H.pdf (Translation of WO-2014-196154-A1) (Year: 2014).*
Communication dated Oct. 3, 2023, issued in Japanese Application No. 2022-503095.
International Preliminary Report on Patentability issued Aug. 30, 2022 in International Application No. PCT/JP2020/043871.
Written Opinion of the International Searching Authority issued Feb. 2, 2021 in International Application No. PCT/JP2020/043871.
International Search Report issued Feb. 2, 2021 in International Application No. PCT/JP2020/043871.
Japanese Office Action issued May 30, 2023 in Application No. 2022-503095.
Office Action issued May 28, 2024 in Korean Application No. 10-2022-7029255.
Office Action issued May 3, 2024 in Taiwanese Application No. 109142712.
Communication issued Oct. 28, 2024 in Chinese application No. 202080097837.6.

* cited by examiner

METHOD OF MANUFACTURING CONDUCTIVE PATTERN, TOUCH SENSOR, ELECTROMAGNETIC WAVE SHIELD, ANTENNA, WIRING BOARD, CONDUCTIVE HEATING ELEMENT, AND STRUCTURE

CROSS-REFERENCE TO RELATED APPLICATIONS

This application is a continuation application of International Application No. PCT/JP2020/043871, filed Nov. 25, 2020, the disclosure of which is incorporated herein by reference in its entirety. Further, this application claims priority from Japanese Patent Application No. 2020-034129, filed Feb. 28, 2020, the disclosure of which is incorporated herein by reference in its entirety.

BACKGROUND OF THE INVENTION

1. Field of the Invention

The present disclosure relates to a method of manufacturing a conductive pattern, a touch sensor, an electromagnetic wave shield, an antenna, a wiring board, a conductive heating element, and a structure.

2. Description of the Related Art

A conductive pattern such as a fine metal wire is used for various applications. Examples of the applications of the conductive pattern include a touch sensor of a touch panel, an antenna, a fingerprint recognition unit, a foldable device, and a transparent flexible printed circuit (FPC). For example, in the manufacturing of a semiconductor package, a printed wiring board, or a re-distribution layer of an interposer, a fine conductive pattern is formed on a substrate. As the substrate, for example, a film, a sheet, a metal substrate, a ceramic substrate, or glass is used.

As a general method of forming a conductive pattern, for example, a subtractive method or a semi-additive method is known (for example, JP2015-225650A and JP2015-065376A). In the subtractive method, a conductive pattern can be formed, for example, by protecting a conductive layer on a substrate with a resist pattern and subsequently removing the conductive layer that is not protected by the resist pattern by etching. On the other hand, in the semi-additive method, for example, after providing an electroless copper plating layer called a seed layer on a substrate, a resist pattern is further provided on the electroless copper plating layer. Next, after forming a conductive pattern by plating on the electroless copper plating layer where the resist pattern is not provided, the resist pattern and the electroless copper plating layer (seed layer) that are unnecessary are removed.

SUMMARY OF THE INVENTION

For example, in order to reduce the electric resistance of a conductive pattern, a thick conductive pattern may be formed. However, in the subtractive method, the conductive layer protected by the resist pattern may also be corroded by a chemical liquid in a phenomenon (for example, called "side etching") in which isotropic etching also progresses in an in-plane direction of the substrate on which the conductive layer is disposed. The occurrence of the side etching affects the form (for example, shape and dimension) of the conductive pattern formed through the etching. Therefore, for example, it is difficult to form a thick rectangular conductive pattern. In the semi-additive method, there is a problem in that the formation of the conductive pattern is unstabilized due to adhesiveness between the seed layer and the resist pattern. In addition, in a case where the unnecessary seed layer is removed, a part of the conductive pattern may be removed. Therefore, the semi-additive method has also the same problem as the subtractive method.

The present disclosure has been made in consideration of the above-described circumstances.

An object of one aspect of the present disclosure is to provide a method of manufacturing a conductive pattern capable of forming a thick conductive pattern in which the occurrence of form abnormality (for example, breakage, peeling, chipping, the occurrence of a tapered shape caused by side etching, and instability in dimension caused by variation in etching; hereinafter, the same can be applied) is reduced.

An object of another aspect of the present disclosure is to provide a touch sensor having a thick conductive pattern in which the occurrence of form abnormality is reduced.

An object of still another aspect of the present disclosure is to provide an electromagnetic wave shield having a thick conductive pattern in which the occurrence of form abnormality is reduced.

An object of another aspect of the present disclosure is to provide an antenna having a thick conductive pattern in which the occurrence of form abnormality is reduced.

An object of still another aspect of the present disclosure is to provide a wiring board having a thick conductive pattern in which the occurrence of form abnormality is reduced.

An object of still another aspect of the present disclosure is to provide a conductive heating element having a thick conductive pattern in which the occurrence of form abnormality is reduced.

An object of still another aspect of the present disclosure is to provide a structure that is useful as a material for forming a thick conductive pattern in which the occurrence of form abnormality is reduced.

An object of still another aspect of the present disclosure is to provide a structure having a thick conductive pattern in which the occurrence of form abnormality is reduced.

<1> A method of manufacturing a conductive pattern, the method comprising:
- a step of preparing a laminate including a transparent substrate, a light shielding pattern that is formed on the transparent substrate, and a negative tone photosensitive resin layer that is disposed on the transparent substrate and the light shielding pattern and is in contact with the transparent substrate;
- a step of irradiating a surface of the transparent substrate opposite to a surface facing the light shielding pattern with light;
- a step of developing the negative tone photosensitive resin layer to form a resin pattern in a region defined by the transparent substrate and the light shielding pattern; and
- a step of forming a conductive pattern on the light shielding pattern.

<2> The method of manufacturing a conductive pattern according to <1>,
- in which in the step of forming the conductive pattern, the conductive pattern is formed by plating.

<3> The method of manufacturing a conductive pattern according to <2>,
  in which the plating is electroplating.
<4> The method of manufacturing a conductive pattern according to <2>,
  in which the plating is electrolytic copper plating.
<5> The method of manufacturing a conductive pattern according to any one of <1> to <4>,
  in which the light shielding pattern is conductive.
<6> The method of manufacturing a conductive pattern according to any one of <1> to <5>,
  in which an average thickness of the light shielding pattern is 2 μm or less.
<7> The method of manufacturing a conductive pattern according to any one of <1> to <6>,
  in which the step of preparing the laminate includes a step of preparing a laminate precursor including the transparent substrate and a light shielding pattern that is formed on the transparent substrate and a step of forming the negative tone photosensitive resin layer on the transparent substrate and the light shielding pattern.
<8> The method of manufacturing a conductive pattern according to any one of <1> to <6>,
  in which the step of preparing the laminate includes a step of preparing the transparent substrate, a step of forming a light shielding pattern on the transparent substrate, and a step of forming the negative tone photosensitive resin layer on the transparent substrate and the light shielding pattern.
<9> The method of manufacturing a conductive pattern according to <8>,
  in which the step of forming the light shielding pattern includes a step of forming a light shielding layer on the transparent substrate, a step of forming a photosensitive resin layer on the light shielding layer, a step of exposing and developing the photosensitive resin layer to form a resist pattern, and a step of removing the light shielding layer that is not covered with the resist pattern.
<10> The method of manufacturing a conductive pattern according to any one of <7> to <9>,
  in which in the step of forming the negative tone photosensitive resin layer, the negative tone photosensitive resin layer is formed of a photosensitive transfer material.
<11> The method of manufacturing a conductive pattern according to any one of <1> to <10>, further comprising:
  a step of removing the resin pattern after the step of forming the conductive pattern.
<12> The method of manufacturing a conductive pattern according to any one of <1> to <11>,
  in which an average thickness of the resin pattern is more than an average thickness of the light shielding pattern.
<13> The method of manufacturing a conductive pattern according to any one of <1> to <12>,
  in which an average thickness of the resin pattern is 3 μm or more.
<14> The method of manufacturing a conductive pattern according to any one of <1> to <13>,
  in which an average thickness of the resin pattern is 5 μm or more.
<15> The method of manufacturing a conductive pattern according to any one of <1> to <14>,
  in which an average thickness of the resin pattern is 10 μm or more.
<16> The method of manufacturing a conductive pattern according to any one of <1> to <15>,
  in which an average width of the light shielding pattern is 5 μm or less.
<17> The method of manufacturing a conductive pattern according to any one of <1> to <16>,
  in which an average width of the resin pattern is 5 μm or less.
<18> The method of manufacturing a conductive pattern according to any one of <1> to <17>,
  in which the light has a wavelength of 365 nm.
<19> The method of manufacturing a conductive pattern according to any one of <1> to <18>,
  in which the negative tone photosensitive resin layer includes an alkali-soluble polymer, a compound having an ethylenically unsaturated bond, and a photopolymerization initiator.
<20> A touch sensor comprising:
  a conductive pattern that is obtained using the method of manufacturing a conductive pattern according to any one of <1> to <19>.
<21> An electromagnetic wave shield comprising:
  a conductive pattern that is obtained using the method of manufacturing a conductive pattern according to any one of <1> to <19>.
<22> An antenna comprising:
  a conductive pattern that is obtained using the method of manufacturing a conductive pattern according to any one of <1> to <19>.
<23> A wiring board comprising:
  a conductive pattern that is obtained using the method of manufacturing a conductive pattern according to any one of <1> to <19>.
<24> A conductive heating element comprising:
  a conductive pattern that is obtained using the method of manufacturing a conductive pattern according to any one of <1> to <19>.
<25> A structure comprising:
  a transparent substrate;
  a light shielding pattern that is formed on the transparent substrate; and
  a resin pattern that is disposed adjacent to the light shielding pattern on the transparent substrate and is in contact with the transparent substrate,
  in which an average thickness of the light shielding pattern is 2 μm or less, and
  an average thickness of the resin pattern is more than 2 μm.
<26> The structure according to <25>,
  in which an average width of the light shielding pattern is 5 μm or less, and an average width of the resin pattern is 5 μm or less.
<27> A structure comprising:
  a transparent substrate;
  a conductive pattern that is formed on the transparent substrate; and
  a resin pattern that is disposed adjacent to the conductive pattern on the transparent substrate and is in contact with the transparent substrate,
  in which an average thickness of the conductive pattern is 2 μm or more and is less than or equal to an average thickness of the resin pattern, and
  the average thickness of the resin pattern is 2 μm or more.
<28> The structure according to <27>,
  in which an average width of the conductive pattern is 5 μm or less, and an average width of the resin pattern is 5 μm or less.

According to one aspect of the present disclosure, there is provided the method of manufacturing a conductive pattern capable of forming a thick conductive pattern in which the occurrence of form abnormality is reduced.

According to another aspect of the present disclosure, there is provided the touch sensor having a thick conductive pattern in which the occurrence of form abnormality is reduced.

According to still another aspect of the present disclosure, there is provided the electromagnetic wave shield having a thick conductive pattern in which the occurrence of form abnormality is reduced.

According to another aspect of the present disclosure, there is provided the antenna having a thick conductive pattern in which the occurrence of form abnormality is reduced.

According to another aspect of the present disclosure, there is provided the wiring board having a thick conductive pattern in which the occurrence of form abnormality is reduced.

According to still another aspect of the present disclosure, there is provided the conductive heating element having a thick conductive pattern in which the occurrence of form abnormality is reduced.

According to still another aspect of the present disclosure, there is provided the structure that is useful as a material for forming a thick conductive pattern in which the occurrence of form abnormality is reduced.

According to another aspect of the present disclosure, there is provided the structure having a thick conductive pattern in which the occurrence of form abnormality is reduced.

DESCRIPTION OF THE PREFERRED EMBODIMENTS

Figure 1:
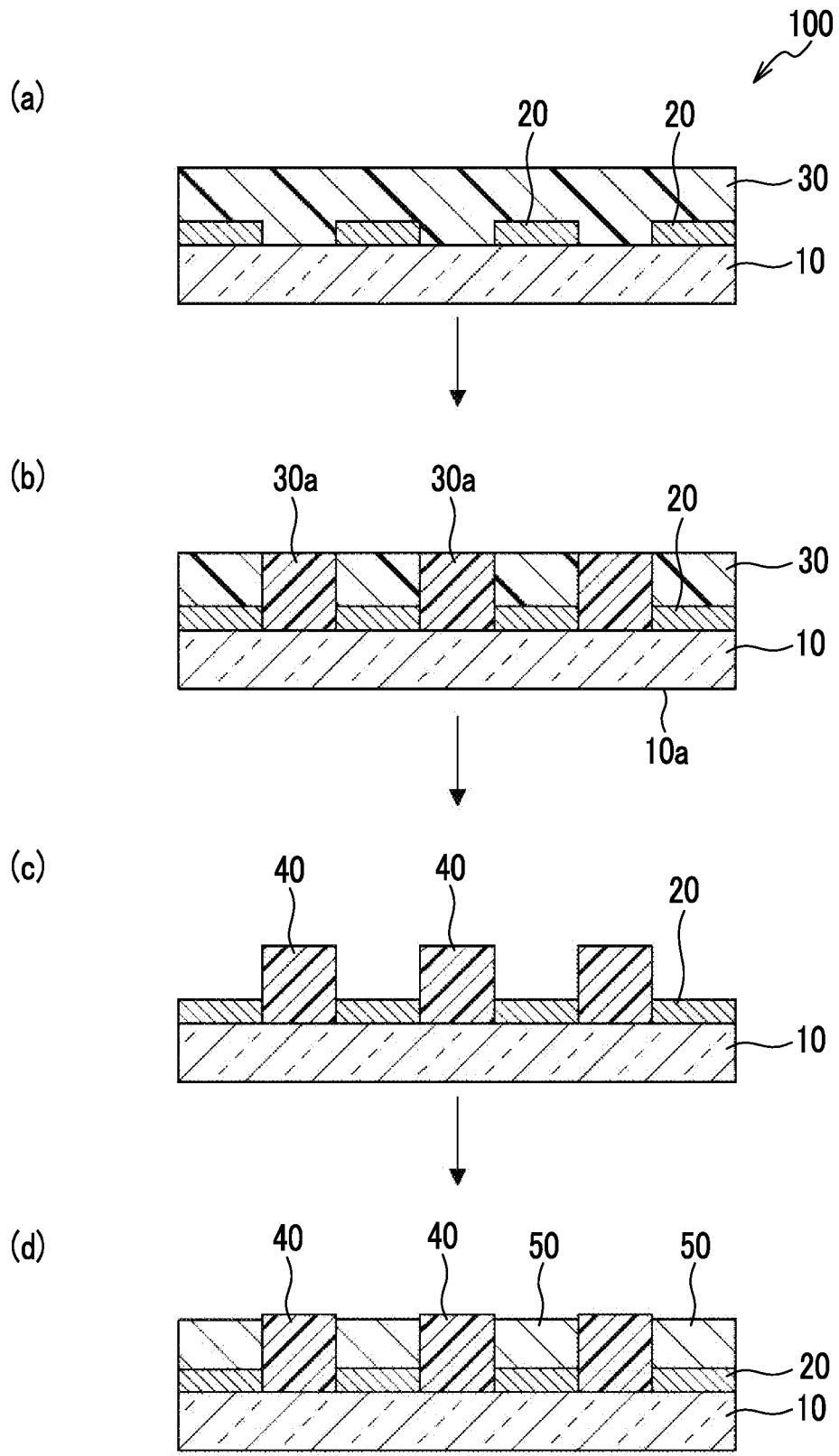
FIG. 1 is a schematic cross-sectional view showing one example of a method of manufacturing a conductive pattern according to the present disclosure.

Hereinafter, embodiments of the present disclosure will be described in detail. The present disclosure is not limited to the following embodiments, and modifications can be made as appropriate within the desired range of the present disclosure.

In a case where an embodiment of the present disclosure is described with reference to the drawings, the description of the same components and the same reference numerals in the drawings will not be repeated. In each of the drawings, components represented by the same reference numerals are the same components. In the drawings, ratios between dimensions do not necessarily represent the actual ratios between the dimensions.

In the present disclosure, numerical ranges represented by "to" include numerical values before and after "to" as lower limit values and upper limit values. Regarding numerical ranges that are described stepwise in the present disclosure, an upper limit value or a lower limit value described in a numerical value may be replaced with an upper limit value or a lower limit value of another stepwise numerical range. In addition, regarding a numerical range described in the present disclosure, an upper limit value or a lower limit value described in a numerical value may be replaced with a value described in Examples.

In addition, in the present disclosure, in a case where a plurality of materials corresponding to each of components in a composition are present, the amount of the component in the composition represents the total amount of the plurality of materials present in the composition unless specified otherwise.

In the present disclosure, the term "step" represents not only an individual step but also a step which is not clearly distinguishable from another step as long as an effect expected from the step can be achieved.

In the present disclosure, "mass %" has the same definition as "wt %", and "part(s) by mass" has the same definition as "part(s) by weight".

In the present disclosure, a combination of two or more preferred aspects is a more preferable aspect.

In the present disclosure, a group (atomic group) which is not described as a substituted group or as an unsubstituted group represents not only a group having no substituent but also a group having a substituent. For example, the description of "alkyl group" represents not only an alkyl group having no substituent (that is, an unsubstituted alkyl group) but also an alkyl group having a substituent (that is, a substituted alkyl group).

In the present disclosure, "(meth)acrylic acid" represents acrylic acid, methacrylic acid, or both acrylic acid and methacrylic acid.

In the present disclosure, "(meth)acryloyl group" represents an acryloyl group, a methacryloyl group, or both an acryloyl group and a methacryloyl group.

In the present disclosure, "(meth)acrylate" represents an acrylate, a methacrylate, or both an acrylate and a methacrylate.

In the present disclosure, "alkali solubility" represents a property in which a solubility of a substance in a sodium carbonate aqueous solution (100 g, concentration of sodium carbonate: 1 mass %) at a liquid temperature of 22° C. is 0.1 g or more.

In addition, in the present disclosure, a chemical structural formula may also be shown as a structural formula in which a hydrogen atom is not shown.

In the present disclosure, "conductivity" represents a property in which a current is likely to flow. The required easiness of flow of current is not particularly limited and may be set to a value depending on the purposes and applications. In a case where the conductivity is represented by volume resistivity, The volume resistivity is preferably less than $1 \times 10^6$ Ωcm and more preferably less than $1 \times 10^4$ Ωcm.

In the present disclosure, "light" represents electromagnetic waves including ultraviolet light, visible light, and infrared light. The light is preferably light in a wavelength range of 200 nm to 1,500 nm, more preferably light in a wavelength range of 250 nm to 450 nm, and still more preferably light in a wavelength range of 300 nm to 410 nm.

In the present disclosure, unless specified otherwise, the weight-average molecular weight (Mw) and the number-average molecular weight (Mn) represent a molecular weight in terms of polystyrene as a standard material. In order to measure the molecular weight, using a gel permeation chromatograph (GPC) including columns "TSKgel GMHxL", "TSKgel G4000HxL", and "TSKgel G2000HxL" (all of which are trade names manufactured by Tosoh Corporation), a compound in tetrahydrofuran (THF) is detected by a differential refractometer.

In the present disclosure, "solid content" refers to all of the components of an object other than a solvent.

In the present disclosure, a reference numeral (for example, A or B) added to a name is used to distinguish between components and does not limit the kind of components, the number of components, and the superiority or inferiority of components.

<Method of Manufacturing Conductive Pattern>

A method of manufacturing a conductive pattern according to the present disclosure comprises: a step (hereinafter, also referred to as "preparation step") of preparing a laminate including a transparent substrate, a light shielding pattern that is formed on the transparent substrate, and a negative tone photosensitive resin layer that is disposed on the transparent substrate and the light shielding pattern and is in contact with the transparent substrate; a step (hereinafter, also referred to as "exposure step") of irradiating a surface of the transparent substrate opposite to a surface facing the light shielding pattern with light; a step (hereinafter, also referred to as "development step") of developing the negative tone photosensitive resin layer to form a resin pattern in a region defined by the transparent substrate and the light shielding pattern; and a step (hereinafter, also referred to as "conductive pattern forming step") of forming a conductive pattern on the light shielding pattern. Using the method of manufacturing a conductive pattern according to the present disclosure, a thick conductive pattern in which the occurrence of form abnormality is reduced is formed.

The reason why the method of manufacturing a conductive pattern according to the present disclosure exhibits the above-described effects is presumed to be as follows. As described above, in the method of manufacturing a conductive pattern in the related art (for example, the subtractive method and the semi-additive method), a step of processing a conductive layer prepared in advance in a patterned manner by etching or a step of removing a seed layer after forming a conductive pattern is adopted. Therefore, the controllability of the shape and dimension of the thick conductive pattern is a problem. On the other hand, in the method of manufacturing a conductive pattern according to the present disclosure, through the preparation step, the exposure step, the development step, and the conductive pattern forming step, for example, the occurrence of form abnormality of the conductive pattern caused by side etching or the removal of the seed layer can be reduced. Here, the method of manufacturing a conductive pattern according to the present disclosure will be described with reference to FIG. 1. FIG. 1 is a schematic cross-sectional view showing one example of the method of manufacturing a conductive pattern according to the present disclosure. (a) of FIG. 1 shows an example of the preparation step. (b) of FIG. 1 shows an example of the exposure step. (c) of FIG. 1 shows an example of the development step. (d) of FIG. 1 shows an example of the conductive pattern forming step. A laminate 100 shown in (a) of FIG. 1 includes a transparent substrate 10, a light shielding pattern 20, and a negative tone photosensitive resin layer 30. As shown in (b) of FIG. 1, a surface (that is, an exposed surface 10a) of the transparent substrate 10 opposite to a surface facing the light shielding pattern 20 is irradiated with light. The proportion of light passing through the light shielding pattern 20 is small. Therefore, light incident into the exposed surface 10a of the transparent substrate 10 passes through an exposed portion 30a of the negative tone photosensitive resin layer 30 through the transparent substrate 10. As a result, the exposed portion 30a of the negative tone photosensitive resin layer 30 is selectively exposed. As shown in (c) of FIG. 1, by developing the negative tone photosensitive resin layer 30, a portion of the negative tone photosensitive resin layer 30 other than the exposed portion 30a is removed, and a resin pattern 40 is formed in a region (that is, a groove) defined by the transparent substrate 10 and the light shielding pattern 20. As shown in (d) of FIG. 1, a conductive pattern 50 is formed on the light shielding pattern 20. As shown in (d) of FIG. 1, the conductive pattern 50 is formed in the region (that is, the groove) defined by the light shielding pattern 20 and the resin pattern 40 that function as a mold. Through the above-described steps, the thick conductive pattern 50 can be easily formed. Accordingly, using the method of manufacturing a conductive pattern according to the present disclosure, a thick conductive pattern in which the occurrence of form abnormality is reduced is formed.

<<Preparation Step>>

In the preparation step, a laminate including a transparent substrate, a light shielding pattern that is formed on the transparent substrate, and a negative tone photosensitive resin layer that is disposed on the transparent substrate and the light shielding pattern and is in contact with the transparent substrate is prepared. In the present disclosure, "preparation" represents that an object is in a usable state. The laminate may be a laminate that is manufactured in advance. The laminate may be a laminate that is manufactured in the preparation step. That is, the preparation step may include a step of manufacturing the laminate.

[Transparent Substrate]

The laminate includes a transparent substrate. In the present disclosure, "transparent" represents that a transmittance at an exposure wavelength is 50% or more. The transmittance at the exposure wavelength defined by the term "transparent" is preferably 80% or more, more preferably 90%, and still more preferably 95%. In the present disclosure, "the transmittance at the exposure wavelength" refers to a transmittance at a wavelength of light that arrives at an object (for example, the transparent substrate) in the exposure step. For example, in a case where a light source having a wavelength of 365 nm is used in the exposure step, "the transmittance at the exposure wavelength" refers to a transmittance at a wavelength of 365 nm. In the present disclosure, "transmittance" refers to a ratio of an intensity of emitted light transmitted through and emitted from a measurement object to an intensity of incidence light in a case where light is incident in a direction (that is, a thickness direction) perpendicular to a main surface of the measurement object. The transmittance is measured using MCPD Series (manufactured by Otsuka Electronics Co., Ltd.).

The shape of the transparent substrate is not limited. As the transparent substrate, for example, a film-shaped or plate-shaped transparent substrate is preferably used.

Examples of the transparent substrate include a resin substrate (for example, a resin film) and a glass substrate. It is preferable that the resin substrate is a resin substrate through which visible light transmits. Examples of preferable components of the resin substrate through which visible light transmits include a polyamide resin, a polyethylene terephthalate resin, a polyethylene naphthalate resin, a cycloolefin resin, a polyimide resin, and a polycarbonate resin. Examples of more preferable components of the resin substrate through which visible light transmits include polyamide, polyethylene terephthalate (PET), a cycloolefin polymer (COP), polyethylene naphthalate (PEN), polyimide, and polycarbonate. The transparent substrate is preferably a polyamide film, a polyethylene terephthalate film, a cycloolefin polymer (COP), a polyethylene naphthalate film, a polyimide film, or a polycarbonate film and more preferably a polyethylene terephthalate film.

Examples of the transparent substrate include paper phenol, paper epoxy, a glass composite, glass epoxy, polytetrafluoroethylene, and a rigid flexible material in which a hard material and a soft material are combined. The transparent substrate may be a porous transparent substrate. The transparent substrate may include a filler and an additive.

The surface of the transparent substrate may be reformed, for example, an alkali treatment or energy ray irradiation.

The structure of the transparent substrate may be a monolayer structure or a multilayer structure. The transparent substrate may include, for example, a functional layer. Examples of the functional layer include an adhesive layer, a hard coat layer, and a refractive index adjusting layer.

The thickness of the transparent substrate is not limited. The average thickness of the transparent substrate is preferably 10 μm to 200 μm, more preferably 20 μm to 120 μm, and still more preferably 20 μm to 100 μm. The average thickness of the transparent substrate is measured using the following method. Using a scanning electron microscope (SEM), a cross section in a direction (that is, a thickness direction) perpendicular to a main surface of the transparent substrate is observed. The thickness of the transparent substrate is measured at 10 points based on the obtained observation image. By averaging the measured values, the average thickness of the transparent substrate is obtained. A transmission electron microscope (TEM) may be used instead of a scanning electron microscope (SEM) depending on the thickness of the object.

It is preferable that a total light transmittance of the transparent substrate is high. The total light transmittance of the transparent substrate is preferably 50% or more, more preferably 80% or more, still more preferably 90% or more, and still more preferably 95% or more. The upper limit of the total light transmittance of the transparent substrate is not limited. The total light transmittance of the transparent substrate may be determined in a range of 100% or less. The total light transmittance is measured using a method defined by "JIS K 7361-1".

[Light Shielding Pattern]

The laminate includes a light shielding pattern that is formed on the transparent substrate. For example, as shown in (b) of FIG. 1, the laminate 100 includes the light shielding pattern 20 such that a part (that is, the exposed portion 30a) of the negative tone photosensitive resin layer 30 can be selectively exposed in the exposure step. In the present disclosure, "light shielding" represents that a transmittance at an exposure wavelength is less than 50%. The transmittance at the exposure wavelength defined by the term "light shielding" is preferably less than 30%, more preferably less than 10%, and still more preferably less than 1%.

It is preferable that the light shielding pattern is conductive. The conductive light shielding pattern can function as an electrical conductor (for example, a seed layer), for example, during plating in the conductive pattern forming step described below. The seed layer can function as, for example, a cathode during electroplating.

Examples of components of the light shielding pattern include a metal. Examples of the metal include niobium (Nb), aluminum (Al), nickel (Ni), zinc (Zn), molybdenum (Mo), tantalum (Ta), titanium (Ti), vanadium (V), chromium (Cr), iron (Fe), cobalt (Co), tungsten (W), copper (Cu), tin (Sn), and manganese (Mn). From the viewpoint of conductivity, the light shielding pattern includes preferably a metal, more preferably at least one selected from the group consisting of Nb, Al, Ni, Zn, Mo, Ta, Ti, V, Cr, Fe, Co, W, Cu, Sn, and Mn, and still more preferably Cu. Cu is preferable from the viewpoint that it has low electric resistance and is inexpensive. The light shielding pattern may include one metal alone or two or more metals. The metal in the light shielding pattern may be a single metal or an alloy. It is preferable that the light shielding pattern includes Cu or a Cu alloy. In a case where the light shielding pattern includes a metal, the metal element in the light shielding pattern may be the same as or different from the metal element in the conductive pattern. It is preferable that the light shielding pattern includes the same metal element as the metal element in the conductive pattern.

The light shielding pattern may include an element other than the metal element. Examples of the element other than the metal element include carbon (C), phosphorus (P), and boron (B). The element other than the metal element may form an alloy with the metal element.

The shape of the light shielding pattern is not limited. The shape of the light shielding pattern may be determined, for example, depending on the desired shape of the conductive pattern.

The structure of the light shielding pattern may be a monolayer structure or a multilayer structure. Components of the respective layers in the light shielding pattern having a multilayer structure may be the same as of different from each other.

The thickness of the light shielding pattern is not limited. The upper limit of the average thickness of the light shielding pattern is preferably 3 μm or less, more preferably 2 μm or less, still more preferably 1 μm or less, and still more preferably 0.5 μm or less. By adjusting the average thickness of the light shielding pattern to be 3 μm or less, the formability of the light shielding pattern can be improved. As a result, the occurrence of the form abnormality of the conductive pattern can be further reduced. The average thickness of the light shielding pattern is preferably 0.05 μm or more, more preferably 0.1 μm or more, and still more preferably 0.3 μm or more. By adjusting the average thickness of the light shielding pattern to be 0.05 μm or more, the transmittance at the exposure wavelength can be reduced. In addition, in a case where the light shielding pattern is used as a seed layer, the productivity of the conductive pattern can be improved. The average thickness of the light shielding pattern is measured using a method conforming to the method of measuring the average thickness of the transparent substrate.

The width of the light shielding pattern is not limited. The width of the light shielding pattern may be determined depending on, for example, the width of the conductive pattern that is formed in the conductive pattern forming step. The average width of the light shielding pattern is preferably 50 μm or less, more preferably 10 μm or less, still more preferably 5 μm or less, and still more preferably 2 μm or less. The average width of the light shielding pattern is preferably 0.1 μm or more and more preferably 0.5 μm or more. The average width of the light shielding pattern is the arithmetic mean value of the widths of the light shielding pattern measured at five points.

The light shielding pattern may be in contact with the transparent substrate directly or through another layer. Examples of the other layer include an adhesion layer. For example, the laminate may include an adhesion layer that is provided between the transparent substrate and the light shielding pattern. Components of the adhesion layer are not limited. The components of the adhesion layer may be determined depending on, for example, an adhesive strength between the transparent substrate and the light shielding pattern and stability in a use environment (for example, humidity and temperature) of the conductive pattern obtained in the method of manufacturing a conductive pattern according to the present disclosure. It is preferable that the adhesion layer includes at least one selected from Nb, Al, Ni, Zn, Mo, Ta, Ti, V, Cr, Fe, Co, W, Cu, Sn, or Mn. The adhesion layer may further include at least one selected from the group consisting of C, oxygen (O), hydrogen (H), and nitrogen (N). The adhesion layer may be a blackening layer. The blackening layer can suppress reflection of light from the light shielding pattern in the exposure step. In a case where the adhesion layer is made to function as a blackening layer, it is preferable that the adhesion layer includes, for example, a Ni—Cu alloy. The adhesion layer that functions as the blackening layer may further include at least one selected from the group consisting of C, O, H, and N. The thickness of the adhesion layer is not limited. The average thickness of the adhesion layer is preferably 3 nm to 50 nm, more preferably 3 nm to 35 nm, and still more preferably 3 nm to 33 nm. The average thickness of the adhesion layer is measured using a method conforming to the method of measuring the average thickness of the transparent substrate.

[Negative Tone Photosensitive Resin Layer]

The laminate includes a negative tone photosensitive resin layer that is disposed on the transparent substrate and the light shielding pattern and is in contact with the transparent substrate. The negative tone photosensitive resin layer may be in contact with the light shielding pattern directly or through another layer. It is preferable that the negative tone photosensitive resin layer is in contact with the light shielding pattern. As the negative tone photosensitive resin layer, a well-known negative tone photosensitive resin layer can be used.

In one embodiment, it is preferable that the negative tone photosensitive resin layer includes a polymer A, a polymerizable compound B, and a photopolymerization initiator. It is preferable that the negative tone photosensitive resin layer includes 10 mass % to 90 mass % of the polymer A, 5 mass % to 70 mass % of the polymerizable compound B, and 0.01 mass % to 20 mass % of the photopolymerization initiator with respect to the total mass of the negative tone photosensitive resin layer. In one embodiment, it is preferable that the negative tone photosensitive resin layer includes an alkali-soluble polymer, a compound having an ethylenically unsaturated bond, and a photopolymerization initiator. Hereinafter, the negative tone photosensitive resin layer will be described in detail.

(Polymer A)

It is preferable that the negative tone photosensitive resin layer includes the polymer A. It is preferable that the polymer A is an alkali-soluble polymer. The alkali-soluble polymer includes a polymer that is likely to be dissolved in an alkali material.

From the viewpoint of further improving the resolution ability by suppressing the swelling of the negative tone photosensitive resin layer by a developer, the acid value of the polymer A is preferably 220 mgKOH/g or less, more preferably less than 200 mgKOH/g, and still more preferably less than 190 mgKOH/g. The lower limit of the acid value is not limited. From the viewpoint of further improving the developability, the acid value of the polymer A is preferably 60 mgKOH/g or more, more preferably 120 mgKOH/g or more, still more preferably 150 mgKOH/g or more, and still more preferably 170 mgKOH/g or more. The acid value of the polymer A can be adjusted depending on, for example, the kind of a constitutional unit forming the polymer A and the content of a constitutional unit having an acid group.

In the present disclosure, the acid value refers to the mass (mg) of potassium hydroxide required to neutralize 1 g of a sample. In the present disclosure, the unit of the acid value is described as mgKOH/g. The acid value can be calculated from, for example, the average content of acid groups in the compound.

The weight-average molecular weight (Mw) of the polymer A is preferably 5,000 to 500,000. The weight-average molecular weight is preferably 500,000 or less from the viewpoint of improving the resolution ability and the developability. The weight-average molecular weight of the polymer A is more preferably 100,000 or less, still more preferably 60,000 or less, and still more preferably 50,000 or less. On the other hand, it is preferable that the weight-average molecular weight is 5,000 or more from the viewpoint controlling characteristics of a development aggregate. The weight-average molecular weight of the polymer A is more preferably 10,000 or more, still more preferably 20,000 or more, and still more preferably 30,000 or more.

The dispersity of the polymer A is preferably 1.0 to 6.0, more preferably 1.0 to 5.0, still more preferably 1.0 to 4.0, and still more preferably 1.0 to 3.0. In the present disclosure, the dispersity refers to a ratio (weight-average molecular weight/number-average molecular weight) of the weight-average molecular weight to the number-average molecular weight.

From the viewpoint of suppressing line width thickening and deterioration in resolution in a case where the focal position during exposure deviates, it is preferable that the polymer A includes a constitutional unit derived from a monomer having an aromatic hydrocarbon group.

Examples of the aromatic hydrocarbon group include a substituted or unsubstituted phenyl group and a substituted or unsubstituted aralkyl group.

A content ratio of the constitutional unit derived from the monomer having an aromatic hydrocarbon group in the polymer A is preferably 20 mass % or more, more preferably 30 mass % or more, still more preferably 40 mass % or more, still more preferably 45 mass % or more, and most preferably 50 mass % or more with respect to the total mass of the polymer A. The upper limit of the content ratio of the constitutional unit derived from the monomer having an aromatic hydrocarbon group is not limited. The content ratio of the constitutional unit derived from the monomer having an aromatic hydrocarbon group in the polymer A is preferably 95 mass % or less and more preferably 85 mass % or less with respect to the total mass of the polymer A. In a case where the negative tone photosensitive resin layer includes plural kinds of polymers A, the content ratio of the constitutional unit derived from the monomer having an aromatic hydrocarbon group is obtained as a weight average value.

Examples of the monomer having an aromatic hydrocarbon group include a monomer having an aralkyl group, styrene, and a polymerizable styrene derivative (for example, methylstyrene, vinyl toluene, tert-butoxystyrene, acetoxystyrene, 4-vinylbenzoic acid, a styrene dimer, or a styrene trimer). It is preferable that the monomer having an aromatic hydrocarbon group is a monomer having an aralkyl group or styrene.

Examples of the aralkyl group include a substituted or unsubstituted phenylalkyl group (excluding a benzyl group) and a substituted or unsubstituted benzyl group. Among these, a substituted or unsubstituted benzyl group is preferable.

Examples of the monomer having a phenylalkyl group include phenylethyl (meth)acrylate.

Examples of the monomer having a benzyl group include a (meth)acrylate having a benzyl group (for example, benzyl (meth)acrylate or chlorobenzyl (meth)acrylate) and a vinyl monomer having a benzyl group (for example, vinylbenzyl chloride or vinylbenzyl alcohol). It is preferable that the monomer having a benzyl group is benzyl (meth)acrylate.

In one embodiment, in a case where the constitutional unit derived from the monomer having an aromatic hydrocarbon group in the polymer A is a constitutional unit derived from benzyl (meth)acrylate, a content ratio of the constitutional unit derived from the benzyl (meth)acrylate monomer in the polymer A is preferably 50 mass % to 95 mass %, more preferably 60 mass % to 90 mass %, still more preferably 70 mass % to 90 mass %, and still more preferably 75 mass % to 90 mass % with respect to the total mass of the polymer A.

In one embodiment, in a case where the constitutional unit derived from the monomer having an aromatic hydrocarbon group in the polymer A is a constitutional unit derived from styrene, a content ratio of the constitutional unit derived from styrene in the polymer A is preferably 20 mass % to 55 mass %, more preferably 25 to 45 mass %, still more preferably 30 mass % to 40 mass %, and still more preferably 30 mass % to 35 mass % with respect to the total mass of the polymer A.

In one embodiment, it is preferable that the polymer A that includes the constitutional unit derived from the monomer having an aromatic hydrocarbon group is a copolymer obtained by polymerizing the monomer having an aromatic hydrocarbon group and at least one selected from the group consisting of a first monomer described below and a second monomer described below. The copolymer includes the constitutional unit derived from the monomer having an aromatic hydrocarbon group and at least one selected from the group consisting of a constitutional unit derived from the first monomer and a constitutional unit derived from the second monomer.

The polymer A may be a polymer that does not include the constitutional unit derived from the monomer having an aromatic hydrocarbon group. The polymer A that does not include the constitutional unit derived from the monomer having an aromatic hydrocarbon group is preferably a polymer obtained by polymerizing at least one of the first monomer (excluding the monomer having an aromatic hydrocarbon group) described below and more preferably a copolymer obtained by polymerizing at least one of the first monomer (excluding the monomer having an aromatic hydrocarbon group) described below and at least one of the second monomer (excluding the monomer having an aromatic hydrocarbon group) described below.

In one embodiment, the polymer A is preferably a polymer obtained by polymerizing at least one of the first monomer described below and more preferably a copolymer obtained by polymerizing at least one of the first monomer described below and at least one of the second monomer described below. The copolymer includes the constitutional unit derived from the first monomer and the constitutional unit derived from the second monomer.

The first monomer is a monomer having a carboxy group and a polymerizable unsaturated group in a molecule. The first monomer may be a monomer not having an aromatic hydrocarbon group in a molecule. Examples of the first monomer include (meth)acrylic acid, fumaric acid, cinnamic acid, crotonic acid, itaconic acid, 4-vinylbenzoic acid, maleic anhydride, and maleic acid half ester. It is preferable that the first monomer is (meth)acrylic acid.

A content ratio of the constitutional unit derived from the first monomer in the polymer A is preferably 5 mass % to 50 mass %, more preferably 10 mass % to 40 mass %, and still more preferably 15 mass % to 30 mass % with respect to the total mass of the polymer A.

The second monomer is a monomer that is non-acidic and has at least one polymerizable unsaturated group in a molecule. The second monomer may be a monomer not having an aromatic hydrocarbon group in a molecule. Examples of the second monomer include a (meth)acrylate compound, an ester compound of vinyl alcohol, and (meth)acrylonitrile. In the present disclosure, "(meth)acrylonitrile" represents acrylonitrile, methacrylonitrile, or both acrylonitrile and methacrylonitrile.

Examples of the (meth)acrylate compound include methyl (meth)acrylate, ethyl (meth)acrylate, n-propyl (meth)acrylate, isopropyl (meth)acrylate, n-butyl (meth)acrylate, isobutyl (meth)acrylate, tert-butyl (meth)acrylate, 2-hydroxyethyl (meth)acrylate, 2-hydroxypropyl (meth)acrylate, cyclohexyl (meth)acrylate, and 2-ethylhexyl (meth)acrylate.

Examples of the ester compound of vinyl alcohol include vinyl acetate.

The second monomer is preferably at least one selected from the group consisting of methyl (meth)acrylate, 2-ethylhexyl (meth)acrylate, and n-butyl (meth)acrylate, and is more preferably methyl (meth)acrylate.

A content ratio of the constitutional unit derived from the second monomer in the polymer A is preferably 5 mass % to 60 mass %, more preferably 15 mass % to 50 mass %, and still more preferably 20 mass % to 45 mass % with respect to the total mass of the polymer A.

From the viewpoint of suppressing line width thickening and deterioration in resolution in a case where the focal position during exposure deviates, it is preferable that the polymer A is at least one selected from the group consisting of a constitutional unit derived from a monomer having an aralkyl group and a constitutional unit derived from styrene. For example, it is preferable that the polymer A is at least one selected from the group consisting of a copolymer including a constitutional unit derived from methacrylic acid, a constitutional unit derived from benzyl methacrylate, and a constitutional unit derived from styrene and a copolymer including a constitutional unit derived from methacrylic acid, a constitutional unit derived from methyl methacrylate, and a constitutional unit derived from benzyl methacrylate, and a constitutional unit derived from styrene.

The polymer A may have any one of a linear structure, a branched structure, or an alicyclic structure at a side chain. By using a monomer that has a group having a branched structure at a side chain or a monomer that has a group having an alicyclic structure at a side chain, the branched structure or the alicyclic structure can be introduced into the side chain of the polymer A. The group having an alicyclic structure may be a monocycle or a polycycle. Specific examples of the monomer that has a group having a branched structure at a side chain include isopropyl (meth)acrylate, isobutyl (meth)acrylate, sec-butyl (meth)acrylate, tert-butyl (meth)acrylate, isoamyl (meth)acrylate, tert-amyl (meth)acrylate, sec-amyl (meth)acrylate, 2-octyl (meth)acrylate, 3-octyl (meth)acrylate, and tert-octyl (meth)acrylate. Among these, isopropyl (meth)acrylate, isobutyl (meth)acrylate, or tert-butyl methacrylate is preferable, and isopropyl methacrylate or tert-butyl methacrylate is more preferable. Specific examples of the monomer that has a group having an alicyclic structure at a side chain include a monomer having a monocyclic aliphatic hydrocarbon group and a monomer having a polycyclic aliphatic hydrocarbon group. In addition, for example, a (meth)acrylate having an alicyclic hydrocarbon group with 5 to 20 carbon atoms can also be used. More specific examples include (bicyclo[2.2.1] heptyl-2) (meth)acrylate, 1-adamantyl (meth)acrylate, 2-adamantyl (meth)acrylate, 3-methyl-1-adamantyl (meth) acrylate, 3,5-dimethyl-1-adamantyl (meth)acrylate, 3-ethyl-adamantyl (meth)acrylate, 3-methyl-5-ethyl-1-adamantyl (meth)acrylate, 3,5,8-triethyl-1-adamantyl (meth)acrylate, 3,5-dimethyl-8-ethyl-1-adamantyl (meth)acrylate, 2-methyl-2-adamantyl (meth)acrylate, 2-ethyl-2-adamantyl (meth)acrylate, 3-hydroxy-1-adamantyl (meth)acrylate, octahydro-4,7-menthanoindene-5-yl (meth)acrylate, octahydro-4,7-menthanoindene-1-ylmethyl (meth)acrylate, 1-menthyl (meth)acrylate, tricyclodecane (meth)acrylate, 3-hydroxy-2,6,6,-trimethyl-bicyclo [3.1.1]heptyl (meth) acrylate, 3,7,7-trimethyl-4-hydroxy-bicyclo [4.1.0]heptyl (meth)acrylate, (nor)bornyl (meth)acrylate, isobornyl (meth)acrylate, fenchyl (meth)acrylate, 2,2,5-trimethylcyclohexyl(meth)acrylate, and cyclohexyl (meth)acrylate. Among these (meth)acrylic acid esters, cyclohexyl (meth) acrylate, (nor)bornyl (meth)acrylate, isobornyl (meth)acrylate, 1-adamantyl (meth)acrylate, 2-adamantyl (meth)acrylate, fenchyl (meth)acrylate, 1-menthyl (meth)acrylate, or tricyclodecane (meth)acrylate is preferable, and cyclohexyl (meth)acrylate, (nor)bornyl (meth)acrylate, isobornyl (meth)acrylate, 2-adamantyl (meth)acrylate, or tricyclodecane (meth)acrylate is more preferable.

In one embodiment, it is preferable that the polymer A is a polymer including 25 mass % to 60 mass % of the constitutional unit derived from the monomer having an aromatic hydrocarbon group, 20 mass % to 55 mass % of the constitutional unit derived from the first monomer, and 20 mass % to 55 mass % of the constitutional unit derived from the second monomer. It is more preferable that the polymer A is a polymer including 25 mass % to 40 mass % of the constitutional unit derived from the monomer having an aromatic hydrocarbon group, 20 mass % to 35 mass % of the constitutional unit derived from the first monomer, and 30 mass % to 45 mass % of the constitutional unit derived from the second monomer.

In one embodiment, it is preferable that the polymer A is a polymer including 70 mass % to 90 mass % of the constitutional unit derived from the monomer having an aromatic hydrocarbon group and 10 mass % to 25 mass % of the constitutional unit derived from the first monomer.

It is preferable that the glass transition temperature (Tg) of the polymer A is 30° C. to 135° C. In the negative tone photosensitive resin layer, by setting the Tg of the polymer A to be 135° C. or lower, in a case where the focal position during exposure deviates, line width thickening and deterioration in resolution can be suppressed. From the above-described viewpoint, the Tg of the polymer A is more preferably 130° C. or lower, still more preferably 120° C. or lower, and still more preferably 110° C. or lower. In addition, it is preferable that the Tg of the polymer A is 30° C. or higher from the viewpoint of improving edge fusion resistance. From the above-described viewpoint, the Tg of the polymer A is more preferably 40° C. or higher, still more preferably 50° C. or higher, still more preferably 60° C. or higher, and most more preferably 70° C. or higher.

The polymer A may be a commercially available product or a synthetic product. It is preferable that the polymer A is synthesized, for example, by diluting at least one of the above-described monomers described below with a solvent (for example, acetone, methyl ethyl ketone, or isopropanol) to obtain a solution, adding an appropriate amount of a radical polymerization initiator (for example, benzoyl peroxide or azoisobutyronitrile) to the solution, and subsequently heating and stirring the solution. In addition, the synthesis may be performed while adding a part of the mixture to the reaction solution dropwise. After completion of the reaction, a solvent may be further added to adjust the concentration to a desired value. As a synthesis unit, not only solution polymerization but also bulk polymerization, suspension polymerization, or emulsion polymerization may be used.

The negative tone photosensitive resin layer may include one polymer A alone or two or more polymers A.

A content ratio of the polymer A is preferably 10 mass % to 90 mass %, more preferably 30 mass % to 70 mass %, and still more preferably 40 mass % to 60 mass % with respect to the total mass of the negative tone photosensitive resin layer. It is preferable that the content ratio of the polymer A is 90 mass % or less with respect to the negative tone photosensitive resin layer from the viewpoint of controlling the development time. On the other hand, it is preferable that the content ratio of the polymer A is 10 mass % or more with respect to the negative tone photosensitive resin layer from the viewpoint of improving edge fusion resistance.

In a case where the negative tone photosensitive resin layer includes two or more polymers A, it is preferable that the negative tone photosensitive resin layer includes two or more polymers A that include the constitutional unit derived from the monomer having an aromatic hydrocarbon group, or includes the polymer A that includes the constitutional unit derived from the monomer having an aromatic hydrocarbon group and the polymer A that does not include the constitutional unit derived from the monomer having an aromatic hydrocarbon group. In the latter case, a content ratio of the polymer A that includes the constitutional unit derived from the monomer having an aromatic hydrocarbon group is preferably 50 mass % or more, more preferably 70 mass % or more, still more preferably 80 mass % or more, and still more preferably 90 mass % or more with respect to the total mass of the polymer A.

(Polymerizable Compound B)

It is preferable that the negative tone photosensitive resin layer includes the polymerizable compound B. In the present disclosure, "polymerizable compound" refers to a compound that has a bond relating to a polymerization reaction or a polymerizable group and is polymerizable due to the action of a polymerization initiator described below. The polymerizable compound B is a compound different from the polymer A.

Examples of the bond relating to the polymerization reaction in the polymerizable compound B include an ethylenically unsaturated bond.

The polymerizable group in the polymerizable compound B is not limited as long as it is a group relating to the polymerization reaction. Examples of the polymerizable group in the polymerizable compound B include a group having an ethylenically unsaturated bond (for example, a vinyl group, an acryloyl group, a methacryloyl group, a styryl group, or a maleimide group), and a cationically polymerizable group (for example, an epoxy group or an oxetane group). The polymerizable group is preferably a group having an ethylenically unsaturated bond (hereinafter, also referred to as "ethylenically unsaturated group" and more preferably an acryloyl group or a methacryloyl group.

From the viewpoint of further improving the photosensitivity of the negative tone photosensitive resin layer, the polymerizable compound B is preferably a compound having an ethylenically unsaturated bond, more preferably a compound (that is, an ethylenically unsaturated compound) having one or more ethylenically unsaturated groups in one molecule, and still more preferably a compound (that is, a polyfunctional ethylenically unsaturated compound) having two or more ethylenically unsaturated groups in one molecule. In addition, from the viewpoint of further improving resolution ability and peelability, the number of ethylenically unsaturated groups in one molecule of the ethylenically unsaturated compound is preferably 6 or less, more preferably 3 or less, and still more preferably 2 or less.

It is preferable that the ethylenically unsaturated compound is a (meth)acrylate compound having one or more (meth)acryloyl groups in one molecule.

From the viewpoint of further improving a balance between the photosensitivity, the resolution ability, and the peelability in the negative tone photosensitive resin layer, the polymerizable compound B is preferably at least one selected from the group consisting of a compound having two ethylenically unsaturated groups in one molecule (that is, a bifunctional ethylenically unsaturated compound) and a compound having three ethylenically unsaturated groups in one molecule (that is, a trifunctional ethylenically unsaturated compound) and more preferably a compound having two ethylenically unsaturated groups in one molecule.

From the viewpoint of improving the peelability of the negative tone photosensitive resin layer, a ratio of the content of the bifunctional ethylenically unsaturated compound to the content of the polymerizable compound B in the negative tone photosensitive resin layer is preferably 60 mass % or more, more preferably more than 70 mass %, and still more preferably 90 mass % or more. The upper limit of the ratio of the content of the bifunctional ethylenically unsaturated compound to the content of the polymerizable compound B is not limited and may be 100 mass %. That is, all of the polymerizable compounds B in the negative tone photosensitive resin layer may be the bifunctional ethylenically unsaturated compounds.

—Polymerizable Compound B1—

It is preferable that the negative tone photosensitive resin layer according to the present disclosure includes a polymerizable compound B1 having one or more aromatic ring and two ethylenically unsaturated groups in one molecule. The polymerizable compound B1 is a bifunctional ethylenically unsaturated compound having one or more aromatic rings in one molecule among the polymerizable compounds B.

From the viewpoint of further improving the resolution ability, a ratio of the content of the polymerizable compound B1 to the content of the polymerizable compound B in the negative tone photosensitive resin layer is preferably 40 mass % or more, more preferably 50 mass % or more, still more preferably 55 mass % or more, and still more preferably 60 mass % or more. The upper limit of the ratio of the content of the polymerizable compound B1 to the content of the polymerizable compound B is not limited. From the viewpoint of the peelability, the ratio of the content of the polymerizable compound B1 to the content of the polymerizable compound B is preferably 99 mass % or less, more preferably 95 mass % or less, still more preferably 90 mass % or less, and still more preferably 85 mass % or less.

Examples of the aromatic ring in the polymerizable compound B1 include an aromatic hydrocarbon ring (for example, a benzene ring, a naphthalene ring, or an anthracene ring), an aromatic heterocyclic ring (for example, a thiophene ring, a furan ring, a pyrrole ring, an imidazole ring, a triazole ring, or a pyridine ring), and a fused ring thereof. The aromatic ring is preferably an aromatic hydrocarbon ring and more preferably a benzene ring. The aromatic ring may have a substituent.

From the viewpoint of improving the resolution ability by suppressing the swelling of the negative tone photosensitive resin layer caused by a developer, it is preferable that the polymerizable compound B1 has a bisphenol structure. Examples of the bisphenol structure include a bisphenol A structure derived from bisphenol A (that is, 2,2-bis(4-hydroxyphenyl)propane), a bisphenol F structure derived from bisphenol F (that is, 2,2-bis(4-hydroxyphenyl)methane), and a bisphenol B structure derived from bisphenol B (that is, 2,2-bis(4-hydroxyphenyl)butane). It is preferable that the bisphenol structure is a bisphenol A structure.

Examples of the polymerizable compound B1 having a bisphenol structure include a compound including a bisphenol structure and two polymerizable groups (preferably (meth)acryloyl groups) bonded to both ends of the bisphenol structure. Each of the polymerizable groups may be directly bonded to the bisphenol structure. Each of the polymerizable groups may be bonded to the bisphenol structure through one or more alkyleneoxy groups. The alkyleneoxy group added to both ends of the bisphenol structure is preferably an ethyleneoxy group or propyleneoxy group and more preferably an ethyleneoxy group. The number of alkyleneoxy groups added to the bisphenol structure is not particularly limited and is preferably 4 to 16 and more preferably 6 to 14 in one molecule.

The polymerizable compound B1 having a bisphenol structure is described in paragraphs "0072" to "0080" of JP2016-224162A. The content of the above-described citation is incorporated herein by reference.

The polymerizable compound B1 is preferably a bifunctional ethylenically unsaturated compound having a bisphenol A structure and more preferably 2,2-bis(4-((meth)acryloxypolyalkoxy)phenyl)propane.

Examples of 2,2-bis(4-((meth)acryloxypolyalkoxy)phenyl)propane include 2,2-bis(4-(methacryloxydiethoxy)phenyl)propane (FA-324M, manufactured by Hitachi Chemical Co., Ltd.), 2,2-bis(4-(methacryloxyethoxypropoxy)phenyl)propane, 2,2-bis(4-(methacryloxypentaethoxy)phenyl)propane (BPE-500, manufactured by Shin-Nakamura Chemical Co., Ltd.), 2,2-bis(4-(methacryloxydodecaethoxytetrapropoxy)phenyl)propane (FA-3200MY, manufactured by Hitachi Chemical Co., Ltd.), 2,2-bis(4-(methacryloxypentadecaethoxy)phenyl)propane (BPE-1300, manufactured by Shin-Nakamura Chemical Co., Ltd.), 2,2-bis(4-(methacryloxydiethoxy)phenyl)propane (BPE-200, manufactured by Shin-Nakamura Chemical Co., Ltd.), and ethoxylated (10) bisphenol A diacrylate (NK ESTER A-BPE-10, manufactured by Shin-Nakamura Chemical Co., Ltd.).

Examples of the polymerizable compound B1 include a compound represented by Formula (I).

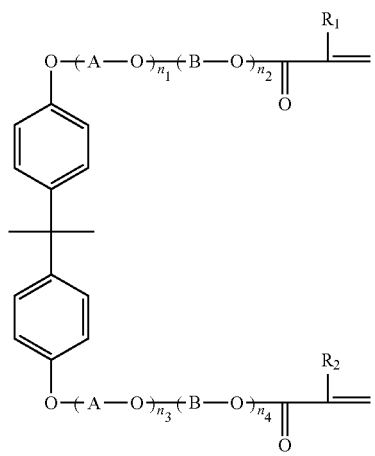

In Formula (I), $R_1$ and $R_2$ each independently represent a hydrogen atom or a methyl group, A represents $C_2H_4$, B represents $C_3H_6$, $n_1$ and $n_3$ each independently an integer of 1 to 39, $n_1+n_3$ represents an integer of 2 to 40, $n_2$ and $n_4$ each independently an integer of 0 to 29, $n_2+n_4$ represents an integer of 0 to 30, and the arrangement of repeating units including -(A—O)- and —(B—O)- may be random or blockwise. In a case where the arrangement is blockwise, any one of -(A—O)- or —(B—O)- may be a bisphenyl group side. $n_2+n_4$ represents preferably an integer of 0 to 10, more preferably an integer of 0 to 4, still more preferably an integer of 0 to 2, and still more preferably 0. $n_1+n_2+n_3+n_4$ represents preferably an integer of 2 to 20, more preferably an integer of 2 to 16, and still more preferably an integer of 4 to 12.

The negative tone photosensitive resin layer may include one polymerizable compound B1 alone or two or more polymerizable compounds B 1.

From the viewpoint of further improving the resolution ability, a content ratio of the polymerizable compound B1 in the negative tone photosensitive resin layer is preferably 10 mass % or more and more preferably 20 mass % or more with respect to the total mass of the negative tone photosensitive resin layer. The upper limit of the content ratio of the polymerizable compound B1 is not limited. From the viewpoints of transfer properties and edge fusion resistance, the content ratio of the polymerizable compound B1 in the negative tone photosensitive resin layer is preferably 70 mass % or less and more preferably 60 mass % or less with respect to the total mass of the negative tone photosensitive resin layer.

The negative tone photosensitive resin layer may include the polymerizable compound B1 and the polymerizable compound B other than the polymerizable compound B1. Examples of the polymerizable compound B other than the polymerizable compound B1 include a monofunctional ethylenically unsaturated compound (that is, a compound having one ethylenically unsaturated group in one molecule), a bifunctional ethylenically unsaturated compound not having an aromatic ring (that is, a compound not having an aromatic ring and having two ethylenically unsaturated groups in one molecule), and a trifunctional or higher ethylenically unsaturated compound (that is, a compound having three or more ethylenically unsaturated groups in one molecule).

Examples of the monofunctional ethylenically unsaturated compound include ethyl (meth)acrylate, ethylhexyl (meth)acrylate, 2-(meth)acryloyloxyethyl succinate, polyethylene glycol mono(meth)acrylate, polypropylene glycol mono(meth)acrylate, and phenoxyethyl (meth)acrylate.

Examples of the bifunctional ethylenically unsaturated compound not having an aromatic ring include alkylene glycol di(meth)acrylate, polyalkylene glycol di(meth)acrylate, urethane di(meth)acrylate, and trimethylolpropane diacrylate.

Examples of the alkylene glycol di(meth)acrylate include tricyclodecane dimethanol diacrylate (A-DCP (manufactured by Shin-Nakamura Chemical Co., Ltd.), tricyclodecane dimethanol dimethacrylate (DCP (manufactured by Shin-Nakamura Chemical Co., Ltd.), 1,9-nonanediol diacrylate (A-NOD-N, manufactured by Shin-Nakamura Chemical Co., Ltd.), 1,6-hexanediol diacrylate (A-HD-N, manufactured by Shin-Nakamura Chemical Co., Ltd.), ethylene glycol dimethacrylate, 1,10-decanediol diacrylate, and neopentyl glycol di(meth)acrylate.

Examples of the polyalkylene glycol di(meth)acrylate include polyethylene glycol di(meth)acrylate, dipropylene glycol diacrylate, tripropylene glycol diacrylate, and polypropylene glycol di(meth)acrylate.

Examples of the urethane di(meth)acrylate include propylene oxide-modified urethane di(meth)acrylate, ethylene oxide- and propylene oxide-modified urethane di(meth) acrylate. Examples of the commercially available product include 8UX-015A (manufactured by Taisei Fine Chemical Co., Ltd.), UA-32P (manufactured by Shin-Nakamura Chemical Co., Ltd.), and UA-1100H (manufactured by Shin-Nakamura Chemical Co., Ltd.).

Examples of the trifunctional or higher ethylenically unsaturated compound include dipentaerythritol (tri/tetra/penta/hexa) (meth)acrylate, pentaerythritol (tri/tetra) (meth)acrylate, trimethylolpropane tri(meth)acrylate, ditrimethylolpropane tetra(meth)acrylate, trimethylol ethane tri(meth) acrylate, isocyanurate tri(meth)acrylate, glycerin tri(meth) acrylate, and an alkylene oxide modified product thereof. In the present disclosure, "(tri/tetra/penta/hexa) (meth)acrylate" is a term including tri(meth)acrylate, tetra(meth)acrylate, penta(meth)acrylate, and hexa(meth)acrylate. In the present disclosure, (tri/tetra) (meth)acrylate is a term including tri(meth)acrylate and tetra(meth)acrylate.

Examples of the alkylene oxide modified product of the trifunctional or higher ethylenically unsaturated compound include a caprolactone-modified (meth)acrylate compound (for example, KAYARAD (registered trade name) DPCA-20 manufactured by Nippon Kayaku Co., Ltd. and A-9300-1CL manufactured by Shin-Nakamura Chemical Co., Ltd.), an alkylene oxide-modified (meth)acrylate compound (for example, KAYARAD RP-1040 manufactured by Nippon Kayaku Co., Ltd., ATM-35E manufactured by Shin-Nakamura Chemical Co., Ltd., A-9300 manufactured by Shin-Nakamura Chemical Co., Ltd., and EBECRYL (registered trade name) 135 manufactured by Daicel-Allnex Ltd.), ethoxylated glycerin triacrylate (for example, A-GLY-9E manufactured by Shin-Nakamura Chemical Co., Ltd.), ARONIX (registered trade name) TO-2349 (manufactured by Toagosei Co., Ltd.), ARONIX M-520 (manufactured by Toagosei Co., Ltd.), and ARONIX M-510 (manufactured by Toagosei Co., Ltd.).

Examples of the polymerizable compound B other than the polymerizable compound B1 include a polymerizable compound having an acid group described in paragraphs "0025" to "0030" of JP2004-239942.

In one embodiment, the negative tone photosensitive resin layer includes preferably the polymerizable compound B1 and the trifunctional or higher ethylenically unsaturated compound and more preferably the polymerizable compound B1 and two or more trifunctional or higher ethylenically unsaturated compounds. In the embodiment, a mass ratio between the polymerizable compound B1 and the trifunctional or higher ethylenically unsaturated compound ([Total Mass of Polymerizable Compound B1]:[Total Mass of Trifunctional or Higher Ethylenically Unsaturated Compound] is preferably 1:1 to 5:1, more preferably 1.2:1 to 4:1, and still more preferably 1.5:1 to 3:1.

The molecular weight of the polymerizable compound B (in a case where the polymerizable compound B has a molecular weight distribution, referred to weight-average molecular weight (Mw)) is preferably 200 to 3,000, more preferably 280 to 2,200, and still more preferably 300 to 2,200.

The negative tone photosensitive resin layer may include one polymerizable compound B alone or two or more polymerizable compounds B.

A content ratio of the polymerizable compound B in the negative tone photosensitive resin layer is preferably 10 mass % to 70 mass %, more preferably 20 mass % to 60 mass %, and still more preferably 20 mass % to 50 mass % with respect to the total mass of the negative tone photosensitive resin layer.

(Photopolymerization Initiator)

It is preferable that the negative tone photosensitive resin layer includes a photopolymerization initiator. The photopolymerization initiator is a compound that initiates polymerization of the polymerizable compound (for example, the polymerizable compound B) in response to irradiation of an actinic ray (for example, ultraviolet light, visible light, and X-ray).

The photopolymerization initiator is not limited, and a well-known photopolymerization initiator can be used. Examples of the photopolymerization initiator include a photoradical polymerization initiator and a photocationic polymerization initiator. Among these, a photoradical polymerization initiator is more preferable.

Examples of the photoradical polymerization initiator include a photopolymerization initiator having an oxime ester structure, a photopolymerization initiator having an α-aminoalkylphenone structure, a photopolymerization initiator having an α-hydroxyalkylphenone structure, a photopolymerization initiator having an acylphosphine oxide structure, and a photopolymerization initiator having an N-phenylglycine structure.

From the viewpoints of photosensitivity, the visibility of the exposed portion, the visibility of the non-exposed portion, and resolution ability, it is preferable that the negative tone photosensitive resin layer includes, as the photoradical polymerization initiator, at least one selected from the group consisting of 2,4,5-triarylimidazole dimer and a derivative of 2,4,5-triarylimidazole dimer. The two 2,4,5-triarylimidazole structures in the 2,4,5-triarylimidazole dimer and the derivative thereof may be the same as or different from each other.

Examples of the derivative of the 2,4,5-triarylimidazole dimer include 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer.

Example of the photoradical polymerization initiator include polymerization initiators described in paragraphs "0031" to "0042" of JP2011-95716A and paragraphs "0064" to "0081" of JP2015-14783A.

Example of the photoradical polymerization initiator include dimethylamino benzoate (DBE, CAS No. 10287-53-3), benzoin methyl ether, anisil(p,p'-dimethoxybenzyl), and benzophenone.

Examples of a commercially available product of the photoradical polymerization initiator include TAZ-110 (manufactured by Midori Kagaku Co., Ltd.), TAZ-111 (manufactured by Midori Kagaku Co., Ltd.), 1-[4-(phenylthio)phenyl]-1,2-octanedione-2-(O-benzoyloxime) (trade name: IRGACURE (registered trade name) OXE-01, manufactured by BASF SE), 1-[9-ethyl-6-(2-methylbenzoyl)-9H-carbazol-3-yl]ethanone-1-(O-acetyloxime) (trade name: IRGACURE OXE-02, manufactured by BASF SE), IRGACURE OXE-03 (manufactured by BASF SE), IRGACURE OXE-04 (manufactured by BASF SE), 2-(dimethylamino)-2-[(4-methylphenyl)methyl]-1-[4-(4-morpholinyl)phenyl]-1-butanone (trade name: Omnirad 379EG, IGM Resins B.V.), 2-methyl-1-(4-methylthiophenyl)-2-morpholinopropan-1-one (trade name: Omnirad 907, IGM Resins B.V.), 2-hydroxy-1-{4-[4-(2-hydroxy-2-methylpropionyl)benzyl]phenyl}-2-methylpropane-1-one (trade name: Omnirad 127, IGM Resins B.V.), 2-benzyl-2-dimethylamino-1-(4-morpholinophenyl)-butanone-1 (trade name: Omnirad 369, IGM Resins B.V.), 2-hydroxy-2-methyl-1-phenylpropane-1-one (trade name: Omnirad 1173, IGM Resins B.V.), 1-hydroxycyclohexyl phenyl ketone (trade name: Omnirad 184, IGM Resins B.V.), 2,2-dimethoxy-1,2-diphenylethane-1-one (trade name: Omnirad 651, IGM Resins B.V.), 2,4,6-trimethylbenzoyl-diphenylphosphine oxide (trade name: Omnirad TPO H, IGM Resins B.V.), bis(2,4,6-trimethylbenzoyl)-phenylphosphine oxide (trade name: Omnirad 819, IGM Resins B.V.), an oxime ester photopolymerization initiator (trade name: Lunar 6, manufactured by DKSH Management Ltd.), 2,2'-bis(2-chlorophenyl)-4,4',5,5'-tetraphenyl-1,2'-biimidazole (another name: 2-(2-chlorophenyl)-4,5-diphenylimidazole dimer, trade name: B-CIM, manufactured by Hampford Research Inc.), and 2-(o-chlorophenyl)-4,5-diphenylimidazole dimer (trade name: BCTB, manufactured by Tokyo Chemical Industry Co., Ltd.).

The photocationic polymerization initiator (that is, photoacid generator) is a compound that generates an acid in response to irradiation of an actinic ray. It is preferable that the photocationic polymerization initiator is a compound that reacts with an actinic ray having a wavelength of 300 nm or longer and preferably a wavelength of 300 nm to 450 nm to produce an acid. Here, the chemical structure of the photocationic polymerization initiator is not limited. In addition, even a photocationic polymerization initiator that does not directly react with an actinic ray having a wavelength of 300 nm or longer can be preferably used in combination with a sensitizer as long as it is a compound that reacts with an actinic ray having a wavelength of 300 nm or longer to produce an acid by using a sensitizer in combination.

The photocationic polymerization initiator is preferably a photocationic polymerization initiator that generates an acid having a pKa of 4 or less, more preferably a photocationic polymerization initiator that generates an acid having a pKa of 3 or less, and still more preferably a photocationic polymerization initiator that generates an acid having a pKa of 2 or less. The lower limit of the pKa is not limited. The pKa of the acid generated from the photocationic polymerization initiator is, for example, preferably −10.0 or more.

Examples of the photocationic polymerization initiator include an ionic photocationic polymerization initiator and a nonionic photocationic polymerization initiator.

Examples of the ionic photocationic polymerization initiator include an onium salt compound (for example, a diaryl iodonium salt compound or a triarylsulfonium salt compound) and a quaternary ammonium salt compound.

Examples of the ionic photocationic polymerization initiator include an ionic photocationic polymerization initiator described in paragraphs "0114" to "0133" of JP2014-85643A.

Examples of the nonionic photocationic polymerization initiator include a trichloromethyl-s-triazine compound, a diazomethane compound, an imide sulfonate compound, and an oxime sulfonate compound. Examples of the trichloromethyl-s-triazine compound, the diazomethane compound, and the imide sulfonate compound include compounds described in paragraphs "0083" to "0088" of JP2011-221494A. In addition, examples of the oxime sulfonate compound include compounds described in paragraphs "0084" to "0088" of WO2018/179640A.

It is preferable that the negative tone photosensitive resin layer includes the photoradical polymerization initiator, and it is more preferable that the negative tone photosensitive resin layer includes at least one selected from the group consisting of 2,4,5-triarylimidazole dimer and a derivative of 2,4,5-triarylimidazole dimer.

The negative tone photosensitive resin layer may include one photopolymerization initiator or two or more photopolymerization initiators.

A content ratio of the photopolymerization initiator in the negative tone photosensitive resin layer is preferably 0.1 mass % or more, more preferably 0.5 mass % or more, and still more preferably 1.0 mass % or more with respect to the total mass of the negative tone photosensitive resin layer. The upper limit of the content ratio of the photopolymerization initiator is not limited. The content ratio of the photopolymerization initiator is preferably 10 mass % or less and more preferably 5 mass % or less with respect to the total mass of the negative tone photosensitive resin layer.

(Optional Components)

The negative tone photosensitive resin layer may include components (hereinafter, referred to as "optional components") other than the above-described components. Examples of the optional components include a colorant, a surfactant, and additives other than the above-described components.

—Colorant—

From the viewpoints of the visibility of the exposed portion, the visibility of the non-exposed portion, pattern visibility after development, and resolution ability, it is preferable that the negative tone photosensitive resin layer includes a colorant (hereinafter, also referred to as "colorant N") in which a maximal absorption wavelength in a wavelength range 400 nm to 780 nm during color development is 450 nm or longer and the maximal absorption wavelength is changed by an acid, a base, or a radical. The detailed mechanism is not clear but is presumed to be that the negative tone photosensitive resin layer includes the colorant N such that adhesiveness with a layer adjacent to the negative tone photosensitive resin layer is improved and resolution ability is further improved.

In the present disclosure, the term "the maximal absorption wavelength is changed by an acid, a base, or a radical" used regarding the colorant may refer to any one of an aspect where the colorant in a colored state is decolored by an acid, a base, or a radical, an aspect where the colorant in a decolored state is colored by an acid, a base, or a radical, or an aspect where a colorant in a colored state is changed to a colored state of another color.

Specifically, the colorant N may be a compound that is exposed to be changed from a decolored state to a colored state or may be a compound that is exposed to be changed from a colored state to a decolored state. In the aspect, the colorant N may be a colorant in which the colored or decolored state is changed by action of an acid, a base, or a radical that is generated by exposure. In addition, the colorant N may be a colorant in which the colored or decolored state is changed by changing the state (for example, pH) in the negative tone photosensitive resin layer with an acid, a base, or a radical that is generated by exposure. On the other hand, the colorant N may be a colorant in which the colored or decolored state is changed by an acid, a base, or a radical as a direct stimulus without passing through exposure.

From the viewpoints of the visibility of the exposed portion, the visibility of the non-exposed portion, and resolution ability, the colorant N is preferably a colorant in which the maximal absorption wavelength is changed by an acid or a radical and more preferably a colorant in which the maximal absorption wavelength is changed by a radical.

From the viewpoints of the visibility of the exposed portion, the visibility of the non-exposed portion, and resolution ability, it is preferable that the negative tone photosensitive resin layer includes, as the colorant N, both of the colorant in which the maximal absorption wavelength is changed by a radical and the photoradical polymerization initiator.

From the viewpoints of the visibility of the exposed portion and the visibility of the non-exposed portion, it is preferable that the colorant N is a colorant that is colored by an acid, a base, or a radical.

Examples of a color development mechanism of the colorant N include an aspect where the negative tone photosensitive resin layer including a photoradical polymerization initiator, a photocationic polymerization initiator (that is, the photoacid generator), or a photobase generator is exposed such that a radical-reactive colorant, an acid-reactive colorant, or a base-reactive colorant (for example, a leuco dye) is colored by a radical, an acid, or a base that is generated from the photoradical polymerization initiator, the photocationic polymerization initiator, or the photobase generator.

From the viewpoints of the visibility of the exposed portion and the visibility of the non-exposed portion, the maximal absorption wavelength of the colorant N in 400 nm to 780 nm as a wavelength range during color development is preferably 550 nm or more, more preferably 550 nm to 700 nm, and still more preferably 550 to 650 nm.

In addition, the colorant N may have one or two or more maximal absorption wavelengths in 400 nm to 780 nm as a wavelength range during color development. In a case where the colorant N has two or more maximal absorption wavelengths in 400 nm to 780 nm as a wavelength range during color development, a maximal absorption wavelength having the highest absorbance among the two or more maximal absorption wavelengths may be 450 nm or more.

The maximal absorption wavelength of the colorant N is measured by measuring a transmission spectrum of a solution (liquid temperature: 25° C.) including the colorant N in a wavelength range of 400 nm to 780 nm using a spectrophotometer (UV3100, manufactured by Shimadzu Corporation) in an air atmosphere and detecting a wavelength (maximal absorption wavelength) having the minimum light intensity.

Examples of the colorant that is colored or decolored by exposure include a leuco compound. Examples of the colorant that is decolored by exposure include a leuco compound, a diarylmethane colorant, an oxazine colorant, a xanthene colorant, an iminonaphthoquinone colorant, an azomethine colorant, and an anthraquinone colorant. It is preferable that the colorant N is a leuco compound from the viewpoints of the visibility of the exposed portion and the visibility of the non-exposed portion.

Examples of the leuco compound include a leuco compound (triarylmethane colorant) having a triarylmethane skeleton, a leuco compound (spiropyran colorant) having a spiropyran skeleton, a leuco compound having a fluoran skeleton (fluoran colorant), a leuco compound (diarylmethane colorant) having a diarylmethane skeleton, a leuco compound (rhodamine lactam colorant) having a rhodamine lactam skeleton, a leuco compound (indolyl phthalide colorant) having an indolyl phthalide skeleton, and a leuco compound (leuco auramine colorant) having a leuco auramine skeleton. The leuco compound is preferably a triarylmethane colorant or a fluoran colorant and more preferably a leuco compound (triphenylmethane colorant) having a triphenylmethane skeleton or a fluoran colorant.

From the viewpoints of the visibility of the exposed portion and the visibility of the non-exposed portion, it is preferable that the leuco compound has a lactone ring, a sultine ring, or a sultone ring. The lactone ring, the sultine ring, or the sultone ring in the leuco compound reacts with a radical generated from the photoradical polymerization initiator or an acid generated from the photocationic polymerization initiator such that the leuco compound can be changed into a ring-closed state to be decolored or the leuco compound can be changed into a ring-open state to be colored. The leuco compound is preferably a compound that has a lactone ring, a sultine ring, or a sultone ring in which the lactone ring, the sultine ring, or the sultone ring is opened by a radical or an acid such that the compound is colored and more preferably a compound that has a lactone ring in which the lactone ring is opened by a radical or an acid such that the compound is colored.

Specific examples of the leuco compound include p,p',p"-hexamethyltriaminotriphenylmethane (Leuco Crystal Violet), Pergascript Blue SRB (manufactured by Ciba-Geigy), Crystal Violet Lactone, Malachite Green Lactone, Benzoyl Leuco Methylene Blue, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide, 3-(4-diethylaminophenyl)-3-(1-ethyl-2-methylindol-3-yl)phthalide, and 3',6'-bis(diphenylamino)spiroisobenzofuran-1(3H),9'-[9H]xanthene-3-one.

As the colorant N, for example, a dye can also be used. Specific examples of the dye include Brilliant Green, Ethyl Violet, Methyl Green, Crystal Violet, Basic Fuchsin, Methyl Violet 2B, Quinaldine Red, Rose Bengal, Metanil Yellow, Thymolsulfonphthalein, Xylenol Blue, Methyl Orange, p-Methyl Red, Congo Red, Benzodiazepine 4B, α-naphthyl Red, Nile Blue 2B, Nile Blue A, Methyl Violet, Malachite Green, Parafuchsin, Victoria Pure Blue-naphthalenesulfonate, Victoria Pure Blue BOH (manufactured by Hodogaya Chemical Co., Ltd.), Oil Blue #603 (manufactured Orient Chemical Industries Co., Ltd.), Oil Pink #312 (manufactured Orient Chemical Industries Co., Ltd.), Oil Red 5B (manufactured Orient Chemical Industries Co., Ltd.), Oil Scarlet #308 (manufactured Orient Chemical Industries Co., Ltd.), Oil Red OG (manufactured Orient Chemical Industries Co., Ltd.), Oil Red RR (manufactured Orient Chemical Industries Co., Ltd.), Oil Green #502 (manufactured Orient Chemical Industries Co., Ltd.), Spiro Red BEH Special (manufactured by Hodogaya Chemical Co., Ltd.), m-Cresol Purple, Cresol Red, Rhodamine B, Rhodamine 6G, Spirorhodamine B, auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)amino-phenyliminonaphthoquinone, 1-phenyl-3-methyl-4-p-diethylaminophenylimino-5-pyrazolone, and 1β-naphthyl-4-p-diethylaminophenylimino-5-pyrazolone.

From the viewpoints of the visibility of the exposed portion, the visibility of the non-exposed portion, pattern visibility after development, and resolution ability, the colorant N is preferably a colorant in which the maximal absorption wavelength is changed by a radical and more preferably a colorant that is colored by a radical.

The colorant N is preferably Leuco Crystal Violet, Crystal Violet Lactone, Brilliant Green, or Victoria Pure Blue-naphthalenesulfonate.

The negative tone photosensitive resin layer may include one colorant N alone or two or more colorants N.

From the viewpoints of the visibility of the exposed portion, the visibility of the non-exposed portion, pattern visibility after development, and resolution ability, a content ratio of the colorant N is preferably 0.1 mass % or more, more preferably 0.1 mass % to 10 mass %, still more preferably 0.1 mass % to 5 mass %, and still more preferably 0.1 mass % to 1 mass % with respect to the total mass of the negative tone photosensitive resin layer.

The content ratio of the colorant N refers to a content ratio of the colorant in a case where all of the colorants N in the negative tone photosensitive resin layer are in a colored state. Hereinafter, a method of quantifying the content ratio of the colorant N will be described using a colorant that is colored by a radical as an example. Two solutions in which a colorant (0.001 g) and a colorant (0.01 g) are dissolved in methyl ethyl ketone (100 mL), respectively, are prepared. IRGACURE OXE-01 (manufactured by BASF SE) as a photoradical polymerization initiator is added to each of the obtained solutions, and a radical is generated by irradiating the solution with light at 365 nm such that all of the colorants are in a colored state. Next, in the air atmosphere, the absorbance of each of the solutions at a liquid temperature of 25° C. is measured using a spectrophotometer (UV3100, manufactured by Shimadzu Corporation) to create a calibration curve. Next, the absorbance of the solution in which all of the colorants are colored is measured using the same method as described above, except that the negative tone photosensitive resin layer (3 g) is dissolved in methyl ethyl ketone instead of the colorant. The content of the colorant in the negative tone photosensitive resin layer is calculated based on the calibration curve from the absorbance of the obtained solution including the negative tone photosensitive resin layer.

—Surfactant—

From the viewpoint of thickness uniformity, it is preferable that the negative tone photosensitive resin layer includes a surfactant. Examples of the surfactant include an anionic surfactant, a cationic surfactant, a nonionic surfactant, and an amphoteric surfactant. Among these, a nonionic surfactant is more preferable.

Examples of the nonionic surfactant include a polyoxyethylene higher alkyl ether compound, a polyoxyethylene higher alkyl phenyl ether compound, a higher fatty acid diester compound of polyoxyethylene glycol, a silicone nonionic surfactant, and a fluorine nonionic surfactant.

From the viewpoint of further improving resolution ability, it is preferable that the negative tone photosensitive resin layer includes a fluorine nonionic surfactant. It is presumed that, by the negative tone photosensitive resin layer including the fluorine nonionic surfactant, permeation of the etchant into the negative tone photosensitive resin layer is suppressed and side etching is reduced. Examples of a commercially available product of the fluorine nonionic surfactant include MEGAFACE (registered trade name) F-551 (manufactured by DIC Corporation), MEGAFACE F-552 (manufactured by DIC Corporation), and MEGAFACE F-554 (manufactured by DIC Corporation).

Examples of the surfactant include a surfactant described in paragraphs "0120" to "0125" of WO2018/179640A, a surfactant described in paragraph "0017" of JP4502784B, and a surfactant described in paragraphs "0060" to "0071" of JP2009-237362A.

The negative tone photosensitive resin layer may include one surfactant alone or two or more surfactants.

A content ratio of the surfactant is preferably 0.001 mass % to 10 mass % and more preferably 0.01 mass % to 3 mass % with respect to the total mass of the negative tone photosensitive resin layer.

—Additive—

Examples of the additive include a radical polymerization inhibitor, a sensitizer, a plasticizer, a heterocyclic compound, a benzotriazole compound, a carboxybenzotriazole compound, a resin other than the polymer A, and a solvent. The negative tone photosensitive resin layer may include one additive alone or two or more additives.

The negative tone photosensitive resin layer may include a radical polymerization inhibitor. Examples of the radical polymerization inhibitor include a thermal polymerization inhibitor described in paragraph "0018" of JP4502784B. The radical polymerization inhibitor is preferably phenothiazine, phenoxazine, or 4-methoxyphenol. Examples of the radical polymerization inhibitor other than the above-described examples include naphthylamine, cuprous chloride, a nitrosophenylhydroxyamine aluminum salt, and diphenylnitrosamine. In order to prevent deterioration in the sensitivity of the negative tone photosensitive resin layer, it is preferable that a nitrosophenylhydroxyamine aluminum salt is used as the radical polymerization inhibitor.

The negative tone photosensitive resin layer may include a benzotriazole compound. Examples of the benzotriazole compound include 1,2,3-benzotriazole, 1-chloro-1,2,3-benzotriazole, bis(N-2-ethylhexyl)aminomethylene-1,2,3-benzotriazole, bis(N-2-ethylhexyl)aminomethylene-1,2,3-tolyltriazole, and bis(N-2-hydroxyethyl)aminomethylene-1,2,3-benzotriazole.

The negative tone photosensitive resin layer may include a carboxybenzotriazole compound. Examples of the carboxybenzotriazole compound include 4-carboxy-1,2,3-benzotriazole, 5-carboxy-1,2,3-benzotriazole, N-(N,N-di-2-ethylhexyl)aminomethylene carboxybenzotriazole, N-(N,N-di-2-hydroxyethyl)aminomethylene carboxybenzotriazole, and N-(N,N-di-2-ethylhexyl)aminoethylene carboxybenzotriazole. Examples of a commercially available product of the carboxybenzotriazole compound include CBT-1 (manufactured by Johoku-Chemical Co., Ltd.).

A ratio of a total content of the radical polymerization inhibitor, the benzotriazole compound, and the carboxybenzotriazol compound is preferably 0.01 mass % to 3 mass % and more preferably 0.05 mass % to 1 mass % with respect to the total mass of the negative tone photosensitive resin layer. It is preferable that the ratio of the total content of the respective components to be 0.01 mass % or more from the viewpoint of imparting storage stability to the negative tone photosensitive resin layer. On the other hand, it is preferable that the ratio of the total content of the respective components to be 3 mass % or less from the viewpoints of maintaining sensitivity and suppressing decoloration of a dye.

The negative tone photosensitive resin layer may include a sensitizer. The sensitizer is not limited, and a well-known sensitizer can be used. In addition, as the sensitizer, a dye or a pigment can also be used. Examples of the sensitizer include a dialkylaminobenzophenone compound, a pyrazoline compound, an anthracene compound, a coumarin compound, a xanthone compound, a thioxanthone compound, an acridone compound, an oxazole compound, a benzoxazole compound, a thiazole compound, a benzothiazole compound, a triazole compound (for example, 1,2,4-triazole), a stilbene compound, a triazine compound, a thiophene compound, a naphthalimide compound, a triarylamine compound, and an aminoacridine compound.

The negative tone photosensitive resin layer may include one sensitizer alone or two or more sensitizers.

In a case where the negative tone photosensitive resin layer includes a sensitizer, a content ratio of the sensitizer can be appropriately selected depending on the purposes. From the viewpoints of improving sensitivity to a light source and improving a cure rate by improving a balance between a polymerization rate and chain transfer, the content ratio of the sensitizer is preferably 0.01 mass % to 5 mass % and more preferably 0.05 mass % to 1 mass % with respect to the total mass of the negative tone photosensitive resin layer.

The negative tone photosensitive resin layer may include at least one selected from the group consisting of a plasticizer and a heterocyclic compound. Examples of the plasticizer and the heterocyclic compound include compounds described in paragraphs "0097" to "0103" and paragraphs "0111" to "0118" of WO2018/179640A.

The negative tone photosensitive resin layer may include a resin other than the polymer A. Examples of the resin other than the polymer A include an acrylic resin, a styrene-acrylic copolymer (limited to a copolymer where a styrene content is 40 mass % or less), a polyurethane resin, polyvinyl alcohol, polyvinyl formal, a polyamide resin, a polyester resin, an epoxy resin, a polyacetal resin, a polyhydroxystyrene resin, a polyimide resin, a polybenzoxazole resin, a polysiloxane resin, polyethyleneimine, polyallylamine, and polyalkylene glycol.

The negative tone photosensitive resin layer may include a solvent. In a case where the negative tone photosensitive resin layer is formed using a photosensitive resin composition including a solvent, the solvent may remain in the negative tone photosensitive resin layer. The solvent will be described below.

For example, the negative tone photosensitive resin layer may include, as an additive, at least one selected from the group consisting of metal oxide particles, an antioxidant, a dispersant, an acid proliferation agent, a development accelerator, conductive fibers, a thermal radical polymerization initiator, a thermal acid generator, an ultraviolet absorber, a thickener, a crosslinking agent, an organic suspending agent, and an inorganic suspending agent. The additive is described in, for example, paragraphs "0165" to "0184" of JP2014-85643A. The content of the above-described citation is incorporated herein by reference.

(Impurity and the Like)

The negative tone photosensitive resin layer may include a predetermined amount of impurity. Specific examples of the impurity include sodium, potassium, magnesium, calcium, iron, manganese, copper, aluminum, titanium, chromium, cobalt, nickel, zinc, tin, halogen, and ions thereof. Among these, a halide ion, a sodium ion, and a potassium ion are easily incorporated as the impurity. Therefore, it is preferable that the content of the impurity is as follows.

The content of the impurity in the negative tone photosensitive resin layer is preferably 80 ppm or less, more preferably 10 ppm or less, and still more preferably 2 ppm or less by mass. The content of the impurity in the negative tone photosensitive resin layer is 1 ppb or more or 0.1 ppm or more by mass.

Examples of a method of adjusting the impurity to be in the above-described range include a method of selecting a raw material in which the content of the impurity is low as the raw material of the negative tone photosensitive resin layer, a method of preventing incorporation of impurity during the formation of the negative tone photosensitive resin layer, and a method of cleaning manufacturing facility to remove the impurity. Using this method, the content of the impurity can be adjusted to be in the above-described range.

The quantity of the impurity can be determined using a well-known method such as Inductively coupled plasma (ICP)-atomic emission spectrometry, atomic absorption spectrometry, or ion chromatography.

In the negative tone photosensitive resin layer, it is preferable that the contents of benzene, formaldehyde, trichloroethylene, 1,3-butadiene, carbon tetrachloride, chloroform, N,N-dimethylformamide, N,N-dimethylacetamide, and hexane are low. The contents of the compounds in the negative tone photosensitive resin layer are preferably 100 ppm or less, more preferably 20 ppm or less, and still more preferably 4 ppm or less by mass. The contents of the compounds in the negative tone photosensitive resin layer are 10 ppb or more or 100 ppb or more by mass. The contents of the compounds can be suppressed using the same method as that of the metal as the impurity. In addition, the quantities of the compounds can be determined using a well-known measurement method.

From the viewpoint of improving reliability and laminating properties, the content of water in the negative tone photosensitive resin layer is preferably 0.01 mass % to 1.0 mass % and more preferably 0.05 mass % to 0.5 mass %.

(Thickness)

The thickness of the negative tone photosensitive resin layer may be determined, for example, depending on the thickness of the resin pattern formed in a development step described below. The thickness of the negative tone photosensitive resin layer may be determined in a range of, for example, 1 μm to 100 μm.

(Transmittance)

From the viewpoint of improving adhesiveness, the transmittance of light having a wavelength of 365 nm in the negative tone photosensitive resin layer is preferably 10% or more, more preferably 30% or more, and still more preferably 50 or more. The upper limit of the transmittance is not limited. In the negative tone photosensitive resin layer, the transmittance of the light having a wavelength of 365 nm is preferably 99.9% or less.

<Method of Manufacturing Laminate>

As described above, the preparation step may include a step of manufacturing the laminate. In a case where the preparation step includes the step of manufacturing the laminate, it is preferable that the preparation step includes a step of preparing a laminate precursor including the transparent substrate and a light shielding pattern that is formed on the transparent substrate and a step of forming the negative tone photosensitive resin layer on the transparent substrate and the light shielding pattern. In the step of forming the negative tone photosensitive resin layer, it is preferable that the negative tone photosensitive resin layer is formed of a photosensitive transfer material.

In a case where the preparation step includes the step of manufacturing the laminate, it is preferable that the preparation step includes a step of preparing the transparent substrate, a step of forming a light shielding pattern on the transparent substrate, and a step of forming a negative tone photosensitive resin layer on the transparent substrate and the light shielding pattern. It is preferable that the step of forming the light shielding pattern includes a step of forming a light shielding layer on the transparent substrate, a step of forming a photosensitive resin layer on the light shielding layer, a step of exposing and developing the photosensitive resin layer to form a resist pattern, and a step of removing the light shielding layer that is not covered with the resist pattern. In the step of forming the negative tone photosensitive resin layer, it is preferable that the negative tone photosensitive resin layer is formed of a photosensitive transfer material.

Hereinafter, the method of manufacturing the laminate will be described in detail. The method of manufacturing the laminate is not limited as long as it is a method capable of manufacturing the laminate including the above-described components.

Examples of the method of manufacturing the laminate include a method including a step of preparing the transparent substrate, a step of forming a light shielding pattern on the transparent substrate, and a step of forming a negative tone photosensitive resin layer on the transparent substrate and the light shielding pattern. In the method of manufacturing the laminate, the transparent substrate is used as a starting material.

Examples of the method of manufacturing the laminate include a method including a step of preparing a laminate precursor including the transparent substrate and a light shielding layer that is formed on the transparent substrate, a step of forming a light shielding pattern from the light shielding layer, and a step of forming a negative tone photosensitive resin layer on the transparent substrate and the light shielding pattern. In the method of manufacturing the above-described laminate, the laminate precursor including the transparent substrate and the light shielding layer is used as a starting material. The light shielding layer is a layer as the material of the light shielding pattern. Examples of the method of manufacturing the laminate precursor including the transparent substrate and the light shielding layer include a method of forming the light shielding layer on the transparent substrate.

Examples of the method of manufacturing the laminate include a method including a step of preparing a laminate precursor including the transparent substrate and a light shielding pattern that is formed on the transparent substrate and a step of forming the negative tone photosensitive resin layer on the transparent substrate and the light shielding pattern. In the method of manufacturing the above-described laminate, the laminate precursor including the transparent substrate and the light shielding pattern is used as a starting material. Examples of the method of manufacturing the laminate precursor including the transparent substrate and the light shielding pattern include a method of forming the light shielding pattern on the transparent substrate.

(Method of Forming Light Shielding Pattern)

Hereinafter, a method of forming the light shielding pattern will be described. Examples of the method of forming the light shielding pattern include a method of forming the light shielding layer on the transparent substrate and processing the light shielding layer in a patterned manner.

Examples of the method of forming the light shielding layer include sputtering and plating. In the sputtering, for example, a layer (light shielding layer) including Cu, Ti, or Ni can be formed on the transparent substrate. In the metal, Cu that has low electric resistance and is inexpensive is preferable. The component of the layer (light shielding layer) formed by sputtering may be Ni, Al, Nb, W, Ni—P, or Ni—B. Examples of the plating include electroless plating. As a method of the electroless plating, a well-known method can be used. For example, in electroless copper plating, copper can be deposited on the transparent substrate by reaction of copper ions and a reducing agent. It is preferable that a catalyst used in the electroless plating is a mixed catalyst of palladium-tin. The primary particle diameter of the catalyst is preferably 10 nm or less. It is preferable that a plating liquid used in the electroless plating includes hypophosphorous acid as the reducing agent. Examples of the plating include plating methods described below in "Conductive Pattern Forming Step". The structure of the light shielding layer may be a monolayer structure or a multilayer structure. By forming the light shielding layer having a multilayer structure, a conductive pattern having a multilayer structure can be formed. Examples of a method of forming each of the layers in the light shielding layer having a multilayer structure include electroless plating, sputtering, vapor deposition, and coupling agent application.

Examples of a method of processing the light shielding layer in a patterned manner include photolithography. As the photolithography, well-known photolithography can be used. For example, the light shielding pattern can be formed by forming a photosensitive resin layer on the light shielding layer, exposing and developing the photosensitive resin layer to form a resist pattern, and subsequently removing the light shielding layer that is not covered with the resist pattern.

The kind of the photosensitive resin layer formed on the light shielding layer is not limited. The photosensitive resin layer may be a positive tone photosensitive resin layer or a negative tone photosensitive resin layer. Examples of the negative tone photosensitive resin layer include the negative tone photosensitive resin layers described above in "Negative Tone Photosensitive Resin Layer". Examples of a method of forming the photosensitive resin layer include a method using a photosensitive resin composition and a method using a photosensitive transfer material. Examples of the method using the photosensitive resin composition include a method of applying the photosensitive resin composition to the light shielding layer and subsequently drying the photosensitive resin composition. The photosensitive resin composition is a composition including the material of the photosensitive resin layer. Examples of the method using the photosensitive transfer material include a method of bonding the photosensitive transfer material in the photosensitive resin layer and the light shielding layer to each other to dispose the photosensitive resin layer on the light shielding layer. The method of forming the negative tone photosensitive resin layer can refer to "Method of Forming Negative Tone Photosensitive Resin Layer" described below.

An exposure method of the photosensitive resin layer is not limited as long as it is a method capable of forming the exposed portion and the non-exposed portion in the photosensitive resin layer. As the exposure method, a well-known method can be used. A region of the photosensitive resin layer to be exposed may be determined depending on the desired shape of the light shielding pattern. Exposure conditions can refer to "Exposure Step" described below.

A development method of the photosensitive resin layer is not limited as long as it is a method capable of removing the exposed portion of the non-exposed portion in the photosensitive resin layer to process the photosensitive resin layer in a patterned manner. In the development of the negative tone photosensitive resin layer, the non-exposed portion of the negative tone photosensitive resin layer is removed. In the development of the positive tone photosensitive resin layer, the exposed portion of the positive tone photosensitive resin layer is removed. As the development method, a well-known method can be used. Development conditions can refer to "Development Step" described below.

As a method of removing the light shielding layer (that is, the exposed light shielding layer) that is not covered with the resist pattern, a well-known method can be used. For example, in a case where the light shielding layer includes a metal, the light shielding layer that is not covered with the resist pattern can be removed by etching. Examples of the etching include wet etching and dry etching. It is preferable that the etching is wet etching. The wet etching is etching using a chemical called an etchant. Examples of the etchant include a sulfuric acid-hydrogen peroxide solution. The composition of the sulfuric acid-hydrogen peroxide solution is not limited. Examples of the sulfuric acid-hydrogen peroxide solution include a sulfuric acid-hydrogen peroxide solution in which the concentration of sulfuric acid is 1 vol % to 10 vol % and the concentration of hydrogen peroxide is 1 vol % to 10 vol %. The temperature of the sulfuric acid-hydrogen peroxide solution can be set in a range of, for example, 20° C. to 35° C. The dipping time in the sulfuric acid-hydrogen peroxide solution can be set in a range of, for example, 1 minute to 10 minutes. In a case where the light shielding layer includes copper, the sulfuric acid-hydrogen peroxide solution can be used until the concentration of copper dissolved in the sulfuric acid-hydrogen peroxide solution is, for example, 50 g/L. Examples of the etchant include a cupric chloride solution. The composition of the cupric chloride solution is not limited. As the cupric chloride solution, for example, a solution including 20 mass % to 35 mass % of cupric chloride and 1 mass % to 7 mass % of chlorine can be preferably used. In this case, etching conditions are not limited to the above-described conditions. For example, the temperature of the etchant and the dipping time in the etchant may be determined depending on the composition of the light shielding layer, the thickness of the light shielding layer, and the kind of the etchant.

In a method of manufacturing a laminate including an adhesion layer between the transparent substrate and the light shielding pattern, For example, the adhesion layer may be formed on the transparent substrate before forming the light shielding pattern. Examples of a method of forming the adhesion layer include electroless plating, sputtering, and vapor deposition. Examples of the method of forming the adhesion layer include a method including application, drying, and sintering of a metal fine particle dispersion liquid in which metal fine particles are dispersed.

In the method of manufacturing the laminate, the surface of the transparent substrate may be optionally roughened through a desmear treatment before forming the adhesion layer and the light shielding pattern. Examples of the desmear treatment liquid (oxidative roughening liquid) include a chromium/sulfuric acid roughening liquid, an alkaline permanganate roughening liquid (for example, sodium permanganate roughening liquid), and a sodium fluoride/chromium/sulfuric acid roughening liquid.

(Method of Forming Negative Tone Photosensitive Resin Layer)

Hereinafter, a method of forming the negative tone photosensitive resin layer will be described. Examples of a method of forming the negative tone photosensitive resin layer include a method using a photosensitive resin composition and a method using a photosensitive transfer material.

—Photosensitive Resin Composition—

Examples using the photosensitive resin composition include a method of applying the photosensitive resin composition to the transparent substrate and the light shielding pattern and subsequently drying the photosensitive resin composition.

Components of the photosensitive resin composition may be determined depending on components of the desired negative tone photosensitive resin layer. Preferable examples of the components of the photosensitive resin composition include the components described above in "Negative Tone Photosensitive Resin Layer". Examples of the photosensitive resin composition include a composition including the polymer A, the polymerizable compound B, and the photopolymerization initiator. In order to adjust the viscosity of the photosensitive resin composition to easily form the photosensitive resin layer, it is preferable that the photosensitive resin composition includes a solvent.

The solvent is not limited as long as it is a solvent in which the components (for example, the polymer A, the polymerizable compound B, and the polymerization initiator) of the photosensitive resin composition can be dissolved or dispersed, and a well-known solvent can be used. Examples of the solvent include an alkylene glycol ether solvent, an alkylene glycol ether acetate solvent, an alcohol solvent (for example, methanol or ethanol), a ketone solvent (for example, acetone or methyl ethyl ketone), an aromatic hydrocarbon solvent (for example, toluene), an aprotic polar solvent (for example, N,N-dimethylformamide), a cyclic ether solvent (for example, tetrahydrofuran), an ester solvent, an amide solvent, and a lactone solvent.

It is preferable that the photosensitive resin composition includes at least one selected from the group consisting of an alkylene glycol ether solvent and an alkylene glycol ether acetate solvent. It is more preferable that the photosensitive resin composition includes at least one selected from the group consisting of an alkylene glycol ether solvent and an alkylene glycol ether acetate solvent and at least one selected from the group consisting of a ketone solvent and a cyclic ether solvent. It is still more preferable that the photosensitive resin composition includes at least one selected from the group consisting of an alkylene glycol ether solvent and an alkylene glycol ether acetate solvent, a ketone solvent, and a cyclic ether solvent.

Examples of the alkylene glycol ether solvent include ethylene glycol monoalkyl ether, ethylene glycol dialkyl ether, propylene glycol monoalkyl ether, propylene glycol dialkyl ether, diethylene glycol dialkyl ether, dipropylene glycol monoalkyl ether, and dipropylene glycol dialkyl ether.

Examples of the alkylene glycol ether acetate solvent include ethylene glycol monoalkyl ether acetate, propylene glycol monoalkyl ether acetate, diethylene glycol monoalkyl ether acetate, and dipropylene glycol monoalkyl ether acetate.

As the solvent, a solvent described in paragraphs "0092" to "0094" of WO2018/179640 or a solvent described in paragraph "0014" of JP2018-177889A may be used. The contents of the above-described citations are incorporated herein by reference.

The photosensitive resin composition may include one solvent alone or two or more solvents.

A content ratio of the solvent in the photosensitive resin composition is preferably 50 parts by mass to 1,900 parts by mass and more preferably 100 parts by mass to 900 parts by mass with respect to 100 parts by mass of the total solid content of the photosensitive resin composition.

A method of preparing the photosensitive resin composition is not limited. Examples of a method of preparing the photosensitive resin composition include a method of preparing the photosensitive resin composition by preparing a solution in which each of the components is dissolved in the solvent in advance and mixing the obtained solutions at a predetermined ratio. It is preferable that the photosensitive resin composition is filtered using a filter having a pore diameter of 0.2 μm to 30 μm before forming the negative tone photosensitive resin layer.

A method of applying the photosensitive resin composition is not limited, and a well-known method can be used. Examples of the application method include slit coating, spin coating, curtain coating, and ink jet coating.

—Photosensitive Transfer Material—

Examples of the method using the photosensitive transfer material include a method of bonding the photosensitive transfer material in the negative tone photosensitive resin layer and the transparent substrate having the light shielding pattern to dispose the negative tone photosensitive resin layer on the transparent substrate and the light shielding pattern. In the method of bonding the photosensitive transfer material in the negative tone photosensitive resin layer and the transparent substrate having the light shielding pattern, it is preferable that the photosensitive transfer material and the transparent substrate are laminated and are pressurized and heated using a unit such as a roll. For the bonding, a laminator, a vacuum laminator, or an Auto-Cut laminator capable of improving productivity can be used. Hereinafter, components of the photosensitive transfer material will be described.

[Photosensitive Resin Layer]

The photosensitive transfer material includes the negative tone photosensitive resin layer. The negative tone photosensitive resin layer is as described above in "Negative Tone Photosensitive Resin Layer".

[Temporary Support]

It is preferable that the photosensitive transfer material includes a temporary support. The temporary support is a support that can be peeled off from the photosensitive transfer material. The temporary support can support at least the negative tone photosensitive resin layer. The temporary support may be peeled off before the exposure step. The temporary support may be peeled off after irradiating the temporary support with light without peeling off the temporary support in the exposure step. By irradiating the temporary support with light without peeling off the temporary support in the exposure step, the influence of dirt and dust in the exposure environment can be avoided.

As the temporary support, a temporary support having light transmittance can be used. In the present disclosure, "having light transmittance" represents that the transmittance of light having a wavelength used for pattern exposure is 50% or more. In the temporary support, the transmittance of light having a wavelength (preferably a wavelength of 365 nm) used for pattern exposure is preferably 60% or more and more preferably 70% or more from the viewpoint of improving the exposure sensitivity of the photosensitive resin layer.

Examples of the temporary support include a glass substrate, a resin film, and paper. From the viewpoints of strength, flexibility, and light transmittance, it is preferable that the temporary support is a resin film.

Examples of the resin film include a polyethylene terephthalate film (that is, a PET film), a cellulose triacetate film, a polystyrene film, and a polycarbonate film. The resin film is preferably a PET film and more preferably a biaxially stretched PET film.

The thickness of the temporary support is not limited. The average thickness of the temporary support may be determined, for example, depending on strength as the temporary support, light transmittance, material, and flexibility required for bonding the photosensitive transfer material and the transparent substrate. The average thickness of the temporary support is preferably 5 μm to 100 μm. Further, from the viewpoints of handleability and general-purpose properties, the average thickness of the temporary support is preferably 5 μm to 50 μm, more preferably 5 μm to 20 μm, still more preferably 10 μm to 20 μm, and still more preferably 10 μm to 16 μm.

The arithmetic average roughness Ra of a surface of the temporary support where the negative tone photosensitive resin layer is disposed is preferably 0.1 μm or less, more preferably 0.05 μm or less, and still more preferably 0.02 μm or less. The lower limit of the arithmetic average roughness Ra is not limited. The arithmetic average roughness Ra of a surface of the temporary support where the negative tone photosensitive resin layer is disposed may be determined in a range of, for example, 0 μm or more.

The arithmetic average roughness Ra is measured using the following method. Using a three-dimensional optical profiler (New View 7300, manufactured by Zygo Corporation), a surface profile of a measurement object is obtained under the following conditions. As measurement and analysis software, Microscope Application of Metro Pro Ver. 8.3.2 is used. Next, a surface map screen is displayed using the software, and histogram data is obtained in the surface map screen. The arithmetic average roughness Ra of the surface of the measurement object is obtained from the obtained histogram data. In a case where the surface of the measurement object comes into contact with a surface of another layer, the arithmetic average roughness Ra of the surface of the measurement object that is exposed by peeling off the measurement object from the other layer may be measured.

It is preferable that the temporary support (in particular, the resin film) does not have, for example, deformation (for example, wrinkles), scratches, or defects. From the viewpoint of the transparency of the temporary support, it is preferable that the number of fine particles, foreign matters, defects, and deposits in the temporary support is small. The number of fine particles, foreign matters, defects, and precipitates having a diameter of 1 μm or more in the temporary support is preferably 50 pieces/10 mm$^2$ or less, more preferably 10 pieces/10 mm$^2$ or less, still more preferably 3 pieces/10 mm$^2$ or less, and still more preferably 0 pieces/10 mm$^2$.

Preferable aspects of the temporary support are described in, for example, paragraphs "0017" and "0018" of JP2014-85643A, paragraphs "0019" to "0026" of JP2016-27363A, paragraphs "0041" to "0057" of WO2012/081680A, paragraphs "0029" to "0040" of WO2018/179370A, and paragraphs "0012" to "0032" of JP2019-101405A. The contents of the above-described citations are incorporated herein by reference.

[Cover Film]

The photosensitive transfer material may include a cover film (also referred to as "protective film"). The cover film can protect the surface of a layer (for example, the negative tone photosensitive resin layer) in contact with the cover film. It is preferable that the photosensitive transfer material includes the temporary support, the negative tone photosensitive resin layer, and the cover film in this order. It is preferable that the photosensitive transfer material includes the cover film in contact with a surface of the negative tone photosensitive resin layer opposite to the side where the temporary support is disposed.

Examples of the cover film include a resin film and paper. From the viewpoints of strength and flexibility, it is preferable that the cover film is a resin film.

Examples of the resin film include a polyethylene film, a polypropylene film, a polyethylene terephthalate film, a cellulose triacetate film, a polystyrene film, and a polycarbonate film. It is preferable that the resin film is a polyethylene film, a polypropylene film, or a polyethylene terephthalate film.

The thickness of the cover film is not limited. The average thickness of the cover film is preferably 5 μm to 100 μm, more preferably 10 μm to 50 μm, and still more preferably 10 μm to 20 μm.

From the viewpoint of further improving resolution ability, the arithmetic average roughness Ra of the surface of the cover film where the negative tone photosensitive resin layer is disposed is preferably 0.3 μm or less, more preferably 0.1 μm or less, and still more preferably 0.05 μm or less. By adjusting the arithmetic average roughness of the surface of the cover film where the negative tone photosensitive resin layer is disposed to be in the above-described range, the thickness uniformity of the negative tone photosensitive resin layer and the resin pattern to be formed is improved. The lower limit of the arithmetic average roughness Ra is not limited. The arithmetic average roughness Ra of a surface of the cover film where the negative tone photosensitive resin layer is disposed is preferably 0.001 μm or more. The arithmetic average roughness Ra of a surface of the cover film where the negative tone photosensitive resin layer is disposed is measured using a method conforming to the method of measuring the arithmetic average roughness Ra described above in "Temporary Support".

[Thermoplastic Resin Layer]

The photosensitive transfer material according to the present disclosure may include a thermoplastic resin layer. It is preferable that the photosensitive transfer material includes the thermoplastic resin layer between the temporary support and the negative tone photosensitive resin layer. The photosensitive transfer material includes the thermoplastic resin layer between the temporary support and the negative tone photosensitive resin layer such that followability to an adhesion object is improved and incorporation of bubbles between the adhesion object and the photosensitive transfer material is suppressed. As a result, interlayer adhesiveness is improved.

It is preferable that the thermoplastic resin layer includes an alkali-soluble resin as the thermoplastic resin.

Examples of the alkali-soluble resin include an acrylic resin, a polystyrene resin, a styrene-acrylic copolymer a polyurethane resin, polyvinyl alcohol, polyvinyl formal, a polyamide resin, a polyester resin, an epoxy resin, a polyacetal resin, a polyhydroxystyrene resin, a polyimide resin, a polybenzoxazole resin, a polysiloxane resin, polyethyleneimine, polyallylamine, and polyalkylene glycol.

From the viewpoints of developability and adhesiveness with a layer adjacent to the thermoplastic resin layer, it is preferable that the alkali-soluble resin is an acrylic resin. Here, "acrylic resin" refers to a resin including at least one selected from the group consisting of a constitutional unit derived from (meth)acrylic acid, a constitutional unit derived from (meth)acrylic acid ester, and a constitutional unit derived from (meth)acrylic acid amide.

In the acrylic resin, a ratio of the total content of the constitutional unit derived from (meth)acrylic acid, the constitutional unit derived from (meth)acrylic acid ester, and the constitutional unit derived from (meth)acrylic acid amide in the acrylic resin is preferably 50 mass % or more with respect to the total mass of the acrylic resin. A ratio of the total content of the constitutional unit derived from (meth)acrylic acid and the constitutional unit derived from (meth)acrylic acid ester is preferably 30 mass % to 100 mass % and more preferably 50 mass % to 100 mass % with respect to the total mass of the acrylic resin.

In addition, it is preferable that the alkali-soluble resin is a polymer having an acid group. Examples of the acid group include a carboxy group, a sulfo group, a phosphate group, and a phosphonate group. Among these, a carboxy group is preferable.

From the viewpoint of developability, the alkali-soluble resin is preferably an alkali-soluble resin having an acid value of 60 mgKOH/g or more and more preferably a carboxy group-containing acrylic resin having an acid value of 60 mgKOH/g or more. The upper limit of the acid value is not limited. The acid value of the alkali-soluble resin is preferably 200 mgKOH/g or less and more preferably 150 mgKOH/g or less.

The carboxy group-containing acrylic resin having an acid value of 60 mgKOH/g or more is not limited and can be appropriately selected and used from well-known resins. Examples of the carboxy group-containing acrylic resin having an acid value of 60 mgKOH/g or more include a carboxy group-containing acrylic resin having an acid value of 60 mgKOH/g or more among polymers described in paragraph "0025" of JP2011-95716A, a carboxy group-containing acrylic resin having an acid value of 60 mgKOH/g or more among polymers described in paragraphs "0033" to "0052" of JP2010-237589A, and a carboxy group-containing acrylic resin having an acid value of 60 mgKOH/g or more among binder polymers described in paragraphs "0053" to "0068" of JP2016-224162A.

A content ratio of a constitutional unit having a carboxy group in the carboxy group-containing acrylic resin is preferably 5 mass % to 50 mass %, more preferably 10 mass % to 40 mass %, and still more preferably 12 mass % to 30 mass % with respect to the total mass of the carboxy group-containing acrylic resin.

From the viewpoints of developability and adhesiveness with a layer adjacent to the thermoplastic resin layer, it is more preferable that the alkali-soluble resin is an acrylic resin including a constitutional unit derived from (meth) acrylic acid.

The alkali-soluble resin may have a reactive group. The reactive group may be, for example, a group capable of addition polymerization. Examples of the reactive group include an ethylenically unsaturated group, a polycondensable group (for example, a hydroxy group or a carboxy group), and a polyaddition reactive group (for example, an epoxy group or a (blocked) isocyanate group).

The weight-average molecular weight (Mw) of the alkali-soluble resin is preferably 1,000 or higher, more preferably 10,000 to 100,000, and still more preferably 20,000 to 50,000.

The thermoplastic resin layer may include one alkali-soluble resin alone or two or more alkali-soluble resins.

From the viewpoints of developability and adhesiveness with a layer adjacent to the thermoplastic resin layer, a content ratio of the alkali-soluble resin is preferably 10 mass % to 99 mass %, more preferably 20 mass % to 90 mass %, still more preferably 40 mass % to 80 mass %, and still more preferably 50 mass % to 70 mass % with respect to the total mass of the thermoplastic resin layer.

It is preferable that the thermoplastic resin layer includes a colorant (hereinafter, also referred to as "colorant B") in which a maximal absorption wavelength in a wavelength range 400 nm to 780 nm during color development is 450 nm or longer and the maximal absorption wavelength is changed by an acid, a base, or a radical. Preferable aspects of the colorant B are the same as the preferable aspects of the above-described colorant N except for the following points.

From the viewpoints of the visibility of the exposed portion, the visibility of the non-exposed portion, and resolution ability, the colorant B is preferably a colorant in which the maximal absorption wavelength is changed by an acid or a radical and more preferably a colorant in which the maximal absorption wavelength is changed by an acid.

From the viewpoints of the visibility of the exposed portion, visibility of the non-exposed portion, and resolution ability, it is preferable that the thermoplastic resin layer includes a colorant in which the maximal absorption wavelength is changed by an acid as the colorant B and a compound described below in which an acid is generated by light.

The thermoplastic resin layer may include one colorant B alone or two or more colorants B.

From the viewpoints of the visibility of the exposed portion and the visibility of the non-exposed portion, a content ratio of the colorant B is preferably 0.2 mass % or more, more preferably 0.2 mass % to 6 mass %, still more preferably 0.2 mass % to 5 mass %, and still more preferably 0.25 mass % to 3.0 mass % with respect to the total mass of the thermoplastic resin layer.

Here, the content ratio of the colorant B refers to a content ratio of the colorant in a case where all of the colorants B in the thermoplastic resin layer are in a colored state. Hereinafter, a method of quantifying the content ratio of the colorant B will be described using a colorant that is colored by a radical as an example. Two solutions in which a colorant (0.001 g) and a colorant (0.01 g) are dissolved in methyl ethyl ketone (100 mL), respectively, are prepared. IRGACURE OXE-01 (manufactured by BASF SE) as a photoradical polymerization initiator is added to each of the obtained solutions, and a radical is generated by irradiating the solution with light at 365 nm such that all of the colorants are in a colored state. Next, in the air atmosphere, the absorbance of each of the solutions at a liquid temperature of 25° C. is measured using a spectrophotometer (UV3100, manufactured by Shimadzu Corporation) to create a calibration curve. Next, the absorbance of the solution in which all of the colorants are colored is measured using the same method as described above, except that the thermoplastic resin layer (0.1 g) is dissolved in methyl ethyl ketone instead of the colorant. The content of the colorant in the thermoplastic resin layer is calculated based on the calibration curve from the absorbance of the obtained solution including the thermoplastic resin layer.

The thermoplastic resin layer may include a compound (hereinafter, also referred to as "compound C") in which an acid, a base, or a radical is generated by light. It is preferable that the compound C is a compound in which an acid, a base, or a radical is generated in response to irradiation of an actinic ray (for example, ultraviolet light or visible light). Examples of the compound C include well-known photoacid generators, photobase generators, and photoradical polymerization initiators (photoradical generators). It is preferable that the compound C is a photoacid generator.

From the viewpoint of resolution ability, it is preferable that the thermoplastic resin layer includes a photoacid generator. Examples of the photoacid generator include the photocationic polymerization initiators that may be included in the negative tone photosensitive resin layer, and preferable aspects thereof are the same except for the following points.

The photoacid generator includes preferably at least one selected from the group consisting of an onium salt compound and an oxime sulfonate compound from the viewpoints of sensitivity and resolution ability and more preferably an oxime sulfonate compound from the viewpoints of sensitivity, resolution ability, and adhesiveness.

In addition, it is also preferable that the photoacid generator has the following structure.

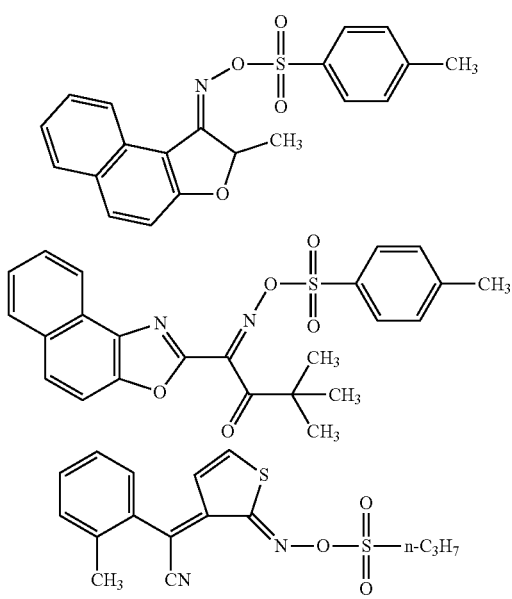

The thermoplastic resin layer may include a photobase generator. Examples of the photobase generator include 2-nitrobenzylcyclohexyl carbamate, triphenylmethanol, O-carbamoyl hydroxylamide, O-carbamoyloxime, [[(2,6-dinitrobenzyl)oxy]carbonyl]cyclohexylamine, bis[[(2-nitrobenzyl)oxy]carbonyl]hexane 1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexamminecobalt (III) tris (triphenylmethylborate), 2-benzyl-2-dimethylamino-1-(4-morpholinophenyl)-butanone, 2,6-dimethyl-3,5-diacetyl-4-(2-nitrophenyl)-1,4-dihydropyridine, and 2,6-dimethyl-3,5-diacetyl-4-(2,4-dinitrophenyl)-1,4-dihydropyridine.

The thermoplastic resin layer may include a photoradical polymerization initiator. Examples of the photoradical polymerization initiator include the photoradical polymerization initiators that may be included in the negative tone photosensitive resin layer, and preferable aspects thereof are the same.

The thermoplastic resin layer may include one compound C alone or two or more compounds C.

From the viewpoints of the visibility of the exposed portion, the visibility of the non-exposed portion, and resolution ability, a content ratio of the compound C is preferably 0.1 mass % to 10 mass % and more preferably 0.5 mass % to 5 mass % with respect to the total mass of the thermoplastic resin layer.

From the viewpoints of resolution ability, adhesiveness with a layer adjacent to the thermoplastic resin layer, and developability, it is preferable that the thermoplastic resin layer includes a plasticizer.

The molecular weight of the plasticizer (regarding the molecular weight of an oligomer or a polymer, refer to weight-average molecular weight (Mw); the same shall be applied in this paragraph) is preferably lower than the molecular weight of the alkali-soluble resin. The molecular weight of the plasticizer is preferably 200 to 2,000.

The plasticizer is not limited as long as it is a compound that is compatible with the alkali-soluble resin and exhibits plasticity. From the viewpoint of imparting plasticity, the plasticizer is preferably a compound having an alkyleneoxy group in a molecule and more preferably a polyalkylene glycol compound. It is preferable that the alkyleneoxy group in the plasticizer has a polyethyleneoxy structure or a polypropyleneoxy structure.

From the viewpoints of resolution ability and storage stability, it is preferable that the plasticizer includes a (meth)acrylate compound. From the viewpoints of compatibility, resolution ability, and adhesiveness with a layer adjacent to the thermoplastic resin layer, it is more preferable that the alkali-soluble resin is an acrylic resin and the plasticizer is a (meth)acrylate compound.

Examples of the (meth)acrylate compound used as the plasticizer include (meth)acrylate compounds described above in "Polymerizable Compound B". In a case where the thermoplastic resin layer and the negative tone photosensitive resin layer are disposed in direct contact with each other in the photosensitive transfer material, it is preferable that the thermoplastic resin layer and the negative tone photosensitive resin layer include the same (meth)acrylate compound. The thermoplastic resin layer and the negative tone photosensitive resin layer include the same (meth)acrylate compound such that interlayer component diffusion is suppressed and storage stability is improved.

In a case where the thermoplastic resin layer includes a (meth)acrylate compound as the plasticizer, from the viewpoint of adhesiveness with a layer adjacent to the thermoplastic resin layer, it is preferable that the (meth)acrylate compound is not polymerized in the exposed portion after exposure.

In one embodiment, from the viewpoints of resolution ability, adhesiveness with a layer adjacent to the thermoplastic resin layer, and developability, it is preferable that the (meth)acrylate compound used as the plasticizer is a (meth)acrylate compound having two or more (meth)acryloyl groups in one molecule.

In one embodiment, it is preferable that the (meth)acrylate compound used as the plasticizer is a (meth)acrylate compound having an acid group or a urethane (meth)acrylate compound.

The thermoplastic resin layer may include one plasticizer alone or two or more plasticizers.

From the viewpoints of resolution ability, adhesiveness with a layer adjacent to the thermoplastic resin layer, and developability, a content ratio of the plasticizer is preferably 1 mass % to 70 mass %, more preferably 10 mass % to 60 mass %, and still more preferably 20 mass % to 50 mass % with respect to the total mass of the thermoplastic resin layer.

From the viewpoint of thickness uniformity, it is preferable that the thermoplastic resin layer includes a surfactant. Examples of the surfactant include the surfactants that may be included in the negative tone photosensitive resin layer, and preferable aspects thereof are the same.

The thermoplastic resin layer may include one surfactant alone or two or more surfactants.

A content ratio of the surfactant is preferably 0.001 mass % to 10 mass % and more preferably 0.01 mass % to 3 mass % with respect to the total mass of the thermoplastic resin layer.

The thermoplastic resin layer may include a sensitizer. Examples of the sensitizer include the sensitizers that may be included in the negative tone photosensitive resin layer.

The thermoplastic resin layer may include one sensitizer alone or two or more sensitizers.

From the viewpoints of improving sensitivity to a light source, the visibility of the exposed portion, and the visibility of the non-exposed portion, a content ratio of the sensitizer is preferably 0.01 mass % to 5 mass % and more preferably 0.05 mass % to 1 mass % with respect to the total mass of the thermoplastic resin layer.

The thermoplastic resin layer may optionally include a well-known additive other than the above-described components.

In addition, the thermoplastic resin layer is described in paragraphs "0189" to "0193" of JP2014-85643A. The content of the above-described citation is incorporated herein by reference.

The thickness of the thermoplastic resin layer is not limited. From the viewpoint of adhesiveness with a layer adjacent to the thermoplastic resin layer, the average thickness of the thermoplastic resin layer is preferably 1 µm or more and more preferably 2 µm or more. The upper limit of the average thickness of the thermoplastic resin layer is not limited. From the viewpoints of developability and resolution ability, the average thickness of the thermoplastic resin layer is preferably 20 µm or less, more preferably 10 µm or less, and still more preferably 5 µm or less.

A method of forming the thermoplastic resin layer is not limited as long as it is a method capable of forming a layer including the above-described components. Examples of the method of forming the thermoplastic resin layer include a method including: applying a thermoplastic resin composition to a surface of the temporary support; and drying the coating film of the thermoplastic resin composition.

Examples of the thermoplastic resin composition include a composition including the above-described components. In order to adjust the viscosity of the thermoplastic resin composition to easily form the thermoplastic resin layer, it is preferable that the thermoplastic resin composition includes a solvent.

The solvent in the thermoplastic resin composition is not limited as long as it is a solvent in which the components in the thermoplastic resin layer can be dissolved or dispersed. Examples of the solvent include the solvents that may be included in the photosensitive resin composition, and preferable aspects thereof are the same.

The thermoplastic resin composition may include one solvent alone or two or more solvents.

A content ratio of the solvent in the thermoplastic resin composition is preferably 50 parts by mass to 1,900 parts by mass and more preferably 100 parts by mass to 900 parts by mass with respect to 100 parts by mass of the total solid content of the thermoplastic resin composition.

The preparation of the thermoplastic resin composition and the formation of the thermoplastic resin layer may be performed using the method of preparing the photosensitive resin composition and the method of forming the negative tone photosensitive resin layer. For example, after preparing the thermoplastic resin composition by preparing a solution in which each of the components in the thermoplastic resin layer is dissolved in the solvent in advance and mixing the obtained solutions at a predetermined ratio, the thermoplastic resin layer may be formed by applying the obtained thermoplastic resin composition to a surface of the temporary support and drying the coating film of the thermoplastic resin composition. In addition, after forming the negative tone photosensitive resin layer on the cover film, the thermoplastic resin layer may be formed on the surface of the negative tone photosensitive resin layer.

[Interlayer]

It is preferable that the photosensitive transfer material includes an interlayer between the thermoplastic resin layer and the negative tone photosensitive resin layer. The interlayer can suppress mixing of the components during formation of a plurality of layers or during storage.

It is preferable that the interlayer is a water-soluble layer from the viewpoints of obtaining developability and suppressing mixing of the components during application of a plurality of layers and storage after the application. In the present disclosure, "water-soluble" represents that the solubility in 100 g of water having a pH of 7.0 at a liquid temperature of 22° C. is 0.1 g or more.

Examples of the interlayer include an oxygen barrier layer having an oxygen barrier function that is described as "separation layer" in JP1993-72724A (JP-H5-72724A). In a case where the interlayer is the oxygen barrier layer, the sensitivity during exposure is improved, and the time load of an exposure device is reduced. As a result, the productivity is improved. The oxygen barrier layer used as the interlayer may be appropriately selected from well-known layers. It is preferable that the oxygen barrier layer used as the interlayer is an oxygen barrier layer that exhibits low oxygen permeability and can be dissolved or dispersed in water or an alkali aqueous solution (a 1 mass % aqueous solution of sodium carbonate at 22° C.).

It is preferable that the interlayer includes a resin. Examples of the resin in the interlayer include a polyvinyl alcohol resin, a polyvinylpyrrolidone resin, a cellulose resin, an acrylamide resin, a polyethylene oxide resin, gelatin, a vinyl ether resin, a polyamide resin, and a copolymer thereof. It is preferable that the resin in the interlayer is a water-soluble resin.

From the viewpoint of suppressing mixing of components between a plurality of interlayers, it is preferable that the resin in the interlayer is different from both of the polymer A in the negative tone photosensitive resin layer and the thermoplastic resin (alkali-soluble resin) in the thermoplastic resin layer.

From the viewpoints of obtaining oxygen barrier properties and suppressing mixing of the components during application of a plurality of layers and storage after the application, the interlayer includes preferably polyvinyl alcohol and more preferably polyvinyl alcohol and polyvinylpyrrolidone.

The interlayer may include one resin or two or more resins.

From the viewpoints of obtaining oxygen barrier properties and suppressing mixing of the components during application of a plurality of layers and storage after the application, a content ratio of the resin in the interlayer is preferably 50 mass % to 100 mass %, more preferably 70 mass % to 100 mass %, still more preferably 80 mass % to 100 mass %, and still more preferably 90 mass % to 100 mass % with respect to the total mass of the interlayer.

In addition, the interlayer may optionally include an additive. Examples of the additive include a surfactant.

The thickness of the interlayer is not limited. The average thickness of the interlayer is preferably 0.1 μm to 5 μm and more preferably 0.5 μm to 3 μm. By adjusting the thickness of the interlayer to be in the above-described range, oxygen bather properties do not deteriorate, mixing of the components can be suppressed during formation of a plurality of layers or during storage, and an increase in time required for removing the interlayer during development can be suppressed.

A method of forming the interlayer is not limited as long as it is a method capable of forming a layer including the above-described components. Examples of the method of forming the interlayer include a method including: applying a composition for forming an interlayer to a surface of the thermoplastic resin layer or the negative tone photosensitive resin layer; and drying the coating film of the composition for forming an interlayer.

Examples of the composition for forming an interlayer include a composition including a resin and any additive. In order to adjust the viscosity of the composition for forming an interlayer to easily form the interlayer, it is preferable that the composition for forming an interlayer includes a solvent. The solvent is not limited as long as it is a solvent in which the resin can be dissolved or dispersed. The solvent is preferably at least one selected from the group consisting of water and a water-miscible organic solvent and more preferably water or a mixed solvent of water and a water-miscible organic solvent.

Examples of the water-miscible organic solvent include an alcohol having 1 to 3 carbon atoms, acetone, ethylene glycol, and glycerin. The water-miscible organic solvent is preferably an alcohol having 1 to 3 carbon atoms and more preferably methanol or ethanol.

[Average Thickness]

The average thickness of the photosensitive transfer material is preferably 5 μm to 55 μm, more preferably 10 μm to 50 μm, and still more preferably 20 μm to 40 μm. The average thickness of the photosensitive transfer material is measured using a method conforming to the method of measuring the average thickness of the transparent substrate.

[Shape]

The shape of the photosensitive transfer material is not limited. From the viewpoint of general-purpose properties and transportability, it is preferable that the shape of the photosensitive transfer material according to the present disclosure has a roll shape. By winding the photosensitive transfer material, the photosensitive transfer material can be made to have a roll shape.

[Manufacturing Method]

A method of manufacturing the photosensitive transfer material is not limited. Examples of the method of manufacturing the photosensitive transfer material include a method including: a step of applying the photosensitive resin composition to the temporary support to form the negative tone photosensitive resin layer; and a step of disposing the cover film on the negative tone photosensitive resin layer. In the method, optionally, the photosensitive resin composition applied to the temporary support may be dried. The drying method is not limited, and a well-known drying method can be used. Examples of the method of disposing the cover film on the negative tone photosensitive resin layer include a method of pressure bonding the cover film to the negative tone photosensitive resin layer.

<<Exposure Step>>

In the exposure step, a surface of the transparent substrate opposite to a surface facing the light shielding pattern is irradiated with light. In the present disclosure, "the surface of the transparent substrate facing the light shielding pattern" refers to a surface facing the light shielding pattern among the surfaces of the transparent substrate. For example, in (b) of FIG. 1, "the face of the transparent substrate facing the light shielding pattern" refers to a surface of the transparent substrate 10 in contact with the light shielding pattern 20, that is, a surface opposite to the exposed surface 10a. As shown in (b) of FIG. 1, in a case where the surface (that is, an exposed surface 10a) of the transparent substrate 10 opposite to the surface facing the light shielding pattern 20 is irradiated with light, a part of the light arriving at the negative tone photosensitive resin layer 30 is blocked by the light shielding pattern 20. As a result, a part (that is, the exposed portion 30a) of the negative tone photosensitive resin layer 30 can be selectively exposed. In the exposed portion of the negative tone photosensitive resin layer, the solubility in a developer decreases. In addition, as compared to a case where light is irradiated in a direction from the negative tone photosensitive resin layer to the transparent substrate, by irradiating the surface of the transparent substrate opposite to the surface facing the light shielding pattern with light, the curing of the negative tone photosensitive resin layer in the vicinity of the transparent substrate can be accelerated. As a result, in the development step described below, the resolution ability of the resin pattern can be improved. In addition, the resin pattern that has a side wall having high linearity can be formed.

A light source used in the exposure step only has to be a light source that irradiates a light having a wavelength (for example, 365 nm or 405 nm) where the negative tone photosensitive resin layer can be exposed. Specific examples of the light source include an ultrahigh pressure mercury lamp, a high-pressure mercury lamp, a metal halide lamp, and a light emitting diode (LED).

The light irradiated in the exposure step includes preferably a wavelength in a wavelength range of 200 nm to 1,500 nm, more preferably a wavelength in a wavelength range of 250 nm to 450 nm, still more preferably a wavelength in a wavelength range of 300 nm to 410 nm, and more preferably a wavelength of 365 nm.

The exposure amount is preferably 5 mJ/cm² to 200 mJ/cm² and more preferably 10 mJ/cm² to 100 mJ/cm².

In the exposure step, a part of the negative tone photosensitive resin layer can be selectively exposed by the light shielding pattern. Therefore, the entire area of the surface of the transparent substrate opposite to the surface facing the light shielding pattern may be irradiated with light.

<<Development Step>>

In the development step, the negative tone photosensitive resin layer is developed to form a resin pattern in a region defined by the transparent substrate and the light shielding pattern. For example, as shown in (c) of FIG. 1, in the development step, the non-exposed portion of the negative tone photosensitive resin layer 30 is removed. AS a result, the resin pattern 40 having a shape corresponding to the shape of the exposed portion 30a of the negative tone photosensitive resin layer 30 is formed.

As the development method, a well-known method can be used. The development of the negative tone photosensitive resin layer can be performed, for example, using a developer. The kind of the developer is not limited as long as the non-exposed portion of the negative tone photosensitive resin layer can be removed. As the developer, a well-known developer (for example, the developer described in JP1993-72724A (JP-H5-72724A) can be used.

It is preferable that the developer is an alkali aqueous solution-based developer including a compound having a pKa of 7 to 13 at a concentration of 0.05 mol/L to 5 mol/L. The developer may include a water-soluble organic solvent and/or a surfactant. As the developer, a developer described in paragraph "0194" of WO2015/093271A is also preferable.

The development method is not particularly limited and may be any one of puddle development, shower development, shower and spin development, or dip development. The shower development is a development treatment of removing the exposed portion or the non-exposed portion by spraying the exposed photosensitive resin layer with the developer by showering.

It is preferable that, after the development step, the substrate is sprayed with a cleaning agent by showering to remove a development residue thereof while being rubbed with a brush.

The liquid temperature of the developer is not limited. The liquid temperature of the developer is preferably 20° C. to 40° C.

It is preferable that the average thickness of the resin pattern is more than the average thickness of the light shielding pattern. By adjusting the average thickness of the resin pattern to be more than the average thickness of the light shielding pattern, a thick conductive pattern can be formed. A ratio of the average thickness of the resin pattern to the average thickness of the light shielding pattern ([Average Thickness of Resin Pattern]/[Average Thickness of Light Shielding Pattern]) is preferably 1.1 or more, more preferably 1.5 or more, and still more preferably 3 or more. The ratio of the average thickness of the resin pattern to the average thickness of the light shielding pattern may be 4, 5, or 10. The average thickness of the resin pattern is measured using a method conforming to the method of measuring the average thickness of the transparent substrate.

The average thickness of the resin pattern is preferably 1 µm or more, more preferably 2 µm or more, and still more preferably more than 2 µm. Further, the average thickness of the resin pattern is preferably 3 µm or more, more preferably 5 µm or more, and still more preferably 10 µm or more. The upper limit of the thickness of the resin pattern is not limited.

The average thickness of the resin pattern may be determined in a range of, for example, 100 µm or less.

The average width of the resin pattern is preferably 50 µm or less and more preferably 5 µm or less. The average width of the resin pattern is preferably 0.3 µm or more and more preferably 0.5 µm or more. The average width of the resin pattern is measured using a method conforming to the method of measuring the average width of the light shielding pattern.

<<Conductive Pattern Forming Step>>

In the conductive pattern forming step, a conductive pattern is formed on the light shielding pattern. For example, as shown in (d) of FIG. 1, in the conductive pattern forming step, the conductive pattern 50 is formed in a region defined by the light shielding pattern 20 and the resin pattern 40.

As a method of forming the conductive pattern, a well-known method can be used. As a material of the conductive pattern, a conductive material can be used depending on applications. It is preferable that the material of the conductive pattern includes Cu or a Cu alloy. It is preferable that the Cu alloy is an alloy including Cu and at least one selected from the group consisting of Ni, Mo, Ta, Ti, V, Cr, Fe, Mn, Co, and W. The conductive pattern formed using the above-described material includes the above-described metal element. The conductive pattern obtained in the conductive pattern forming step may be a conductive pattern consisting of Cu.

As a method of forming the conductive pattern on the light shielding pattern, a well-known method can be used. In the conductive pattern forming step, it is preferable that the conductive pattern is formed by plating. As the plating, a well-known plating can be used. Examples of the plating include electroplating and electroless plating. The plating is preferably electroplating and more preferably electrolytic copper plating.

In the electroplating, by depositing metal on the light shielding pattern, for example, using the light shielding pattern that can function as a seed layer as a cathode, the conductive pattern can be formed on the light shielding pattern.

Examples of components of a plating liquid used in the electroplating include a water-soluble copper salt. As the water-soluble copper salt, a water-soluble copper salt that is typically used as a component of a plating liquid can be used. As the water-soluble copper salt, for example, at least one selected from the group consisting of an inorganic copper salt, an alkanesulfonic acid copper salt, an alkanolsulfonic acid copper salt, and and an organic acid copper salt is preferable. Examples of the inorganic copper salt include copper sulfate, copper oxide, copper chloride, and copper carbonate. Examples of the alkanesulfonic acid copper salt include copper methanesulfonate and copper propanesulfonate. Examples of the alkanolsulfonic acid copper salt include copper isethionate and copper propanolsulfonate. Examples of the organic acid copper salt include copper acetate, copper citrate, and copper tartrate.

The plating liquid may include sulfuric acid. The plating liquid includes sulfuric acid such that the pH of the plating liquid and the sulfate ion concentration can be adjusted.

A method and conditions of electroplating are not limited. For example, by supplying the transparent substrate having undergone the development step in a plating bath to which the plating liquid is added, the conductive pattern can be formed on the light shielding pattern. In the electroplating, for example, by controlling the current density and the transportation speed of the transparent substrate, the conductive pattern can be formed.

The temperature of the plating liquid used in the electroplating is generally 70° C. or lower and preferably 10° C. to 40° C. The current density in the electroplating is generally 0.1 Adm$^2$ to 100 A/dm$^2$ and preferably 0.5 Adm$^2$ to 20 A/dm$^2$. By increasing the current density, the productivity of the conductive pattern can be improved. By decreasing the current density, the thickness uniformity of the conductive pattern can be improved.

In the method of forming the conductive pattern by plating, a plurality of metals may be continuously plated. For example, in the conductive pattern that is formed of the metal such as copper, deterioration in visibility or appearance caused by reflection is a problem. Examples of a method of reducing the reflectivity of the surface of the conductive pattern include an oxidation treatment, a sulfurization treatment, a nitridization treatment, a chlorination treatment, blackening layer coating formation, and black plating. For example, by performing chromium plating after copper plating, a layer including a black material can be formed on the surface of the conductive pattern. A method of reducing the reflectivity of the surface of the conductive pattern is preferably an oxidation treatment or a sulfurization treatment. The oxidation treatment is preferable from the viewpoint that a higher antiglare effect can be obtained and the viewpoints of the simplicity of a waste liquid treatment and environment safety.

After forming the conductive pattern, a post-baking step may be performed. In the post-baking step, by completely thermally curing an unreacted thermosetting component, insulating reliability, curing properties, or plating adhesiveness can be improved. The heating temperature is preferably 80° C. to 240° C. The heating time is preferably 5 minutes to 120 minutes.

After forming the conductive pattern, the surface of the conductive pattern may be protected by a resin layer. For example, by forming a resin layer on the conductive pattern after forming the conductive pattern, the surface of the conductive pattern can be protected. Examples of a component of the resin layer include an acrylic resin, a polyester resin, a polyvinyl acetal resin layer, a polyimide resin, and an epoxy resin. Examples of a method of forming the resin layer include coating and thermal pressure bonding.

The structure of the conductive pattern may be a monolayer structure or a multilayer structure. Components of the respective layers in the conductive pattern having a multilayer structure may be the same as of different from each other.

The thickness of the conductive pattern is not limited. The thickness of the conductive pattern may be determined depending on, for example, applications. In a case where the conductive pattern is used as a wiring line, the average thickness of the conductive pattern may be determined depending on, for example, the size of a current supplied to a wiring line and the wiring width. From the viewpoint of conductivity, the average thickness of the conductive pattern is preferably 0.5 μm or more, more preferably 1 μm or more, and still more preferably 2 μm or more. Further, the average thickness of the conductive pattern is preferably 3 μm or more, more preferably 5 μm or more, and still more preferably 10 μm or more. The average thickness of the conductive pattern is measured using a method conforming to the method of measuring the average thickness of the transparent substrate.

It is preferable that the width of the conductive pattern is small. Specifically, the average width of the conductive pattern is preferably 50 μm or less, more preferably 10 μm or less, still more preferably 5 μm or less, and still more preferably 2 μm or less. By adjusting the average width of the conductive pattern to be 5 μm or less, for example, the visibility of the conductive pattern in a device such as a touch panel that is sensitive to visibility can be reduced. From the viewpoint of conductivity, the average width of the conductive pattern is preferably 0.1 μm or more, more preferably 0.5 μm or more, and still more preferably 0.8 μm or more. The average width of the conductive pattern is measured using a method conforming to the method of measuring the average width of the light shielding pattern.

The surface electrical resistance value of the conductive pattern is preferably lower than 0.2Ω/□ and more preferably lower than 0.15Ω/□. The surface electrical resistance value of the conductive pattern is measured using a four probe method. In a case where the pattern size is too small and it is difficult to perform the measurement, the surface electrical resistance value of the conductive layer may be measured before forming the pattern.

In the conductive pattern forming step, there may be a case where an interface between the conductive pattern and the light shielding pattern is not clearly observed. For example, in a case where the conductive pattern is formed by plating by using the light shielding pattern as a seed layer, there may be a case where the interface between the light shielding pattern and the conductive pattern is not clearly observed. In this case, even in a case where the interface between the conductive pattern and the light shielding pattern is not clearly observed, the object of the present disclosure is not inhibited.

<<Removing Step>>

After the conductive pattern forming step, the resin pattern remaining on the transparent substrate does not need to be removed. The resin pattern may be used as a permanent film. For example, in a case where the conductive pattern is applied to an application where the resin pattern is not required, the resin pattern remaining on the transparent substrate may be removed. In one embodiment, it is preferable that the method of manufacturing a conductive pattern according to the present disclosure further includes a step of removing the resin pattern after the conductive pattern forming step.

Examples of the method of removing the resin pattern include a method of removing the resin pattern through a chemical treatment. It is preferable that the method removing the resin pattern is a method of removing the resin pattern using a remover. Examples of the method using the remover include a method of dipping the transparent substrate including the resin pattern for 1 minute to 30 minutes in the remover that is being stirred at a liquid temperature of preferably 30° C. to 80° C. and more preferably 50° C. to 80° C.

Examples of the remover include a remover in which an inorganic alkali component or an organic alkali component is dissolved in water, dimethyl sulfoxide, N-methylpyrrolidone, or a mixed solution thereof. Examples of the inorganic alkali component include sodium hydroxide and potassium hydroxide. Examples of the organic alkali component include a primary amine compound, a secondary amine compound, a tertiary amine compound, and a quaternary ammonium salt compound.

A method of removing the resin pattern using the remover is not limited to the dip coating method and may be a well-known method (for example, a spraying method, a shower method, or a puddle method) other than the dip coating method.

<<Application>>

The conductive pattern that is obtained using the method of manufacturing a conductive pattern according to the present disclosure can be applied to various applications. Examples of the applications of the conductive pattern that is obtained using the method of manufacturing a conductive pattern according to the present disclosure include a touch sensor, an electromagnetic wave shield, an antenna, a wiring board, and a conductive heating element. In the above-described applications, the conductive pattern that is obtained using the method of manufacturing a conductive pattern according to the present disclosure can function as an electrical conductor. In addition, in the above-described applications, the conductive pattern that is obtained using the method of manufacturing a conductive pattern according to the present disclosure can exhibit various functions depending on properties of the conductive pattern.

<Touch Sensor>

A touch sensor according to the present disclosure includes the conductive pattern that is obtained using the method of manufacturing a conductive pattern according to the present disclosure. In the touch sensor according to the present disclosure, the conductive pattern can be used as, for example, a transparent electrode or a frame wiring. Components of the touch sensor according to the present disclosure are not limited except that they include the conductive pattern that is obtained using the method of manufacturing a conductive pattern according to the present disclosure. As components other than the conductive pattern, components that may be included in a well-known touch sensor can be used. The touch sensor is described in, for example, JP6486341B and JP2016-155978A. The content of the above-described citation is incorporated herein by reference. A method of manufacturing the touch sensor according to the present disclosure is not limited as long as it a method using the conductive pattern that is obtained using the method of manufacturing a conductive pattern according to the present disclosure.

<Electromagnetic Wave Shield>

An electromagnetic wave shield according to the present disclosure includes the conductive pattern that is obtained using the method of manufacturing a conductive pattern according to the present disclosure. In the electromagnetic wave shield according to the present disclosure, the conductive pattern can be used as, for example, an electromagnetic wave shield body. Components of the electromagnetic wave shield according to the present disclosure are not limited except that they include the conductive pattern that is obtained using the method of manufacturing a conductive pattern according to the present disclosure. As components other than the conductive pattern, components that may be included in a well-known electromagnetic wave shield can be used. The electromagnetic wave shield is described in, for example, JP6486382B and JP2012-163951A. The content of the above-described citation is incorporated herein by reference. A method of manufacturing the electromagnetic wave shield according to the present disclosure is not limited as long as it a method using the conductive pattern that is obtained using the method of manufacturing a conductive pattern according to the present disclosure.

<Antenna>

An antenna according to the present disclosure includes the conductive pattern that is obtained using the method of manufacturing a conductive pattern according to the present disclosure. In the antenna according to the present disclosure, the conductive pattern can be used as, for example, a transmission and reception unit or a transmission line unit. Components of the antenna according to the present disclosure are not limited except that they include the conductive pattern that is obtained using the method of manufacturing a conductive pattern according to the present disclosure. As components other than the conductive pattern, components that may be included in a well-known antenna can be used. The antenna is described in, for example, JP2016-219999A. The content of the above-described citation is incorporated herein by reference. A method of manufacturing the antenna according to the present disclosure is not limited as long as it a method using the conductive pattern that is obtained using the method of manufacturing a conductive pattern according to the present disclosure.

<Wiring Board>

A wiring board according to the present disclosure includes the conductive pattern that is obtained using the method of manufacturing a conductive pattern according to the present disclosure. In the wiring board according to the present disclosure, the conductive pattern can be used as, for example, a wiring line of a printed wiring board. Components of the wiring board according to the present disclosure are not limited except that they include the conductive pattern that is obtained using the method of manufacturing a conductive pattern according to the present disclosure. As components other than the conductive pattern, components that may be included in a well-known wiring board can be used. The wiring board is described in, for example, JP05774686B and JP2017-204538A. The content of the above-described citation is incorporated herein by reference. A method of manufacturing the wiring board according to the present disclosure is not limited as long as it a method using the conductive pattern that is obtained using the method of manufacturing a conductive pattern according to the present disclosure.

<Conductive Heating Element>

A conductive heating element according to the present disclosure includes the conductive pattern that is obtained using the method of manufacturing a conductive pattern according to the present disclosure. In the conductive heating element according to the present disclosure, the conductive pattern can be used as, for example, a heating element. Components of the conductive heating element according to the present disclosure are not limited except that they include the conductive pattern that is obtained using the method of manufacturing a conductive pattern according to the present disclosure. As components other than the conductive pattern, components that may be included in a well-known conductive heating element can be used. The conductive heating element is described in, for example, JP6486382B. The content of the above-described citation is incorporated herein by reference. A method of manufacturing the conductive heating element according to the present disclosure is not limited as long as it a method using the conductive pattern that is obtained using the method of manufacturing a conductive pattern according to the present disclosure.

<Structure A>

A structure according to one aspect of the present disclosure comprises: a transparent substrate; a light shielding pattern that is formed on the transparent substrate; and a resin pattern that is disposed adjacent to the light shielding pattern on the transparent substrate and is in contact with the transparent substrate, in which an average thickness of the light shielding pattern is 2 µm or less, and an average thickness of the resin pattern is 2 µm or more. According to the above-described aspect, there is provided the structure that is useful as a material for forming a thick conductive pattern in which the occurrence of form abnormality is reduced. For example, by using the structure according to the above-described aspect, the conductive pattern 50 can be formed as shown in (d) of FIG. 1. Hereinafter, the structure according to the above-described aspect will be referred to as "structure A".

Figure 2:
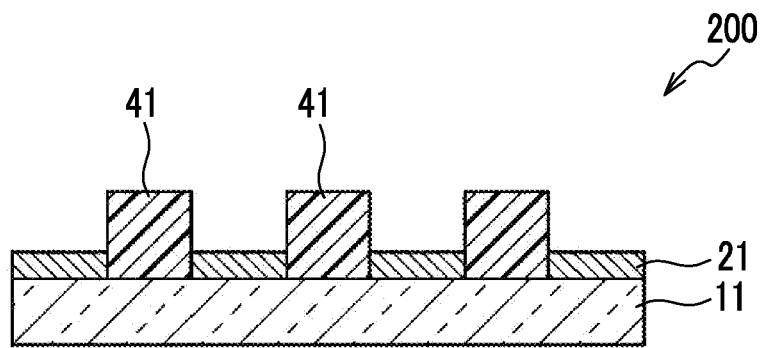
FIG. 2 is a schematic cross-sectional view showing one example of a structure according to the present disclosure.

The structure A according to the present disclosure will be described with reference to FIG. 2. FIG. 2 is a schematic cross-sectional view showing one example of the structure according to the present disclosure. A structure 200 shown in FIG. 2 includes a transparent substrate 11, a light shielding pattern 21, and a resin pattern 41. The light shielding pattern 21 is disposed on the transparent substrate 11. The light shielding pattern 21 is in contact with the transparent substrate 11. As described below, the light shielding pattern 21 may be in contact with the transparent substrate 11 through another layer. The resin pattern 41 is disposed on the transparent substrate 11 and adjacent to the light shielding pattern 21 and is in contact with the transparent substrate 11.

<<Transparent Substrate>>

The structure A according to the present disclosure includes a transparent substrate. Examples of the transparent substrate include the transparent substrates described above in "Method of Manufacturing Conductive Pattern". Preferable aspects of the transparent substrate are the same as the preferable aspects of the transparent substrate described above in "Method of Manufacturing Conductive Pattern".

<<Light Shielding Pattern>>

The structure A according to the present disclosure includes a light shielding pattern that is formed on the transparent substrate. An average thickness of the light shielding pattern is 2 μm or less. Examples of the light shielding pattern include the light shielding pattern described above in "Method of Manufacturing Conductive Pattern". Preferable aspects of the light shielding pattern are the same as the preferable aspects of the light shielding pattern described above in "Method of Manufacturing Conductive Pattern".

The light shielding pattern may be in contact with the transparent substrate directly or through another layer. Examples of the other layer include an adhesion layer. Examples of the adhesion layer include the adhesion layer described above in "Method of Manufacturing Conductive Pattern". Preferable aspects of the adhesion layer are the same as the preferable aspects of the adhesion layer described above in "Method of Manufacturing Conductive Pattern".

<<Resin Pattern>>

The structure A according to the present disclosure includes a resin pattern that is disposed adjacent to the light shielding pattern on the transparent substrate and is in contact with the transparent substrate. An average thickness of the resin pattern is more than 2 μm. Examples of the resin pattern include the resin pattern described above in "Method of Manufacturing Conductive Pattern". Preferable aspects of the resin pattern are the same as the preferable aspects of the resin pattern described above in "Method of Manufacturing Conductive Pattern".

<<Manufacturing Method>>

A method of manufacturing the structure A according to the present disclosure is not limited as long as it is a method capable of manufacturing the structure including the above-described components. The structure A can be manufactured, for example, using the method including the preparation step, the exposure step, and the development step described above in "Method of Manufacturing Conductive Pattern".

<Structure B>

A structure according to another aspect of the present disclosure comprises: a transparent substrate; a conductive pattern that is formed on the transparent substrate; and a resin pattern that is disposed on the transparent substrate and adjacent to the conductive pattern and is in contact with the transparent substrate, in which an average thickness of the conductive pattern is 2 μm or more and is less than or equal to an average thickness of the resin pattern, and the average thickness of the resin pattern is 2 μm or more. According to the above-described aspect, there is provided the structure having a thick conductive pattern in which the occurrence of form abnormality is reduced. Hereinafter, the structure according to the above-described aspect will be referred to as "structure B".

Figure 3:
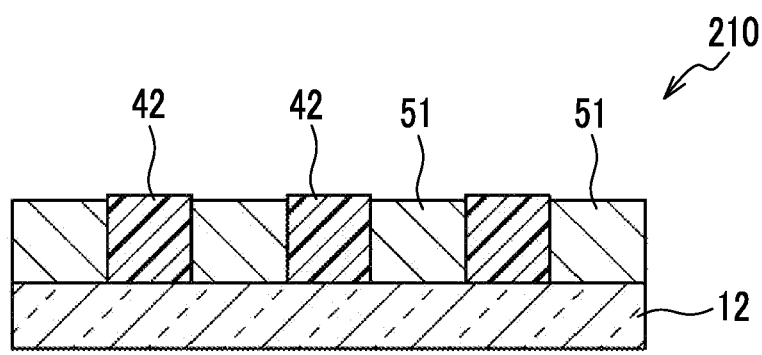
FIG. 3 is a schematic cross-sectional view showing one example of a structure according to the present disclosure.

The structure B according to the present disclosure will be described with reference to FIG. 3. FIG. 3 is a schematic cross-sectional view showing one example of the structure according to the present disclosure. A structure 210 shown in FIG. 3 includes a transparent substrate 12, a conductive pattern 51, and a resin pattern 42. The conductive pattern 51 is disposed on the transparent substrate 12. The conductive pattern 51 is in contact with the transparent substrate 12. As described below, the conductive pattern 51 may be in contact with the transparent substrate 12 through another layer. The resin pattern 42 is disposed on the transparent substrate 12 and adjacent to the conductive pattern 51 and is in contact with the transparent substrate 12.

<<Transparent Substrate>>

The structure B according to the present disclosure includes a transparent substrate. Examples of the transparent substrate include the transparent substrates described above in "Method of Manufacturing Conductive Pattern". Preferable aspects of the transparent substrate are the same as the preferable aspects of the transparent substrate described above in "Method of Manufacturing Conductive Pattern".

<<Conductive Pattern>>

The structure B according to the present disclosure includes a conductive pattern that is formed on the transparent substrate. An average thickness of the conductive pattern is 2 μm or more and is less than or equal to an average thickness of the resin pattern. Examples of the conductive pattern include the conductive pattern described above in "Method of Manufacturing Conductive Pattern". Preferable aspects of the conductive pattern are the same as the preferable aspects of the conductive pattern described above in "Method of Manufacturing Conductive Pattern".

The conductive pattern may be in contact with the transparent substrate directly or through another layer. The other layer may be a conductive layer. For example, in a case where the structure B is manufactured, for example, using the method including the preparation step, the exposure step, the development step, and the conductive pattern forming step described above in "Method of Manufacturing Conductive Pattern", examples of the other layer include the light shielding pattern described above in "Method of Manufacturing Conductive Pattern". Preferable aspects of the light shielding pattern are the same as the preferable aspects of the light shielding pattern described above in "Method of Manufacturing Conductive Pattern".

<<Resin Pattern>>

The structure B according to the present disclosure includes a resin pattern that is disposed on the transparent substrate and adjacent to the conductive pattern and is in contact with the transparent substrate. The average thickness of the resin pattern is 2 μm or more. Examples of the resin pattern include the resin pattern described above in "Method of Manufacturing Conductive Pattern". Preferable aspects of the resin pattern are the same as the preferable aspects of the resin pattern described above in "Method of Manufacturing Conductive Pattern".

<<Manufacturing Method>>

A method of manufacturing the structure B is not limited as long as it is a method capable of manufacturing the structure including the above-described components. The structure B can be manufactured, for example, using the method including the preparation step, the exposure step, the development step, and the conductive pattern forming step described above in "Method of Manufacturing Conductive Pattern".

EXAMPLES

Hereinafter, the present disclosure will be described in detail using Examples. The present disclosure is not limited to the following examples.

<Synthesis of Polymer A-1>

Propylene glycol 1-monomethyl ether (75.0 g) was put into a three-neck flask, and the liquid temperature was increased to 90° C. in a nitrogen atmosphere. A solution including styrene (32.0 g), methacrylic acid (28.0 g), methyl methacrylate (40.0 g), 2,2'-azobis(isobutyronitrile) (0.8 g), and propylene glycol 1-monomethyl ether (75.0 g) was added dropwise to the solution in the three-neck flask maintained at 90° C.±2° C. for 2 hours. By stirring the mixed solution at 90° C.±2° C. for 2 hours after completion of the dropwise addition, a solution (concentration of solid contents: 40.0 mass %) including the polymer A-1 was obtained. The weight-average molecular weight of the polymer A-1 was 40,000.

<Synthesis of Polymer A-2>

A solution including a polymer A-2 (concentration of solid contents: 40.0 mass %) was obtained using the same method as that of the polymer A-1, except that the amounts of the monomers used were changed as follows. The weight-average molecular weight of the polymer A-2 was 60,000.
(1) Styrene: 52.0 g
(2) Methacrylic acid: 29.0 g
(3) Methyl methacrylate: 19.0 g <Synthesis of Polymer A-3>

A solution including a polymer A-3 (concentration of solid contents: 40.0 mass %) was obtained using the same method as that of the polymer A-1, except that the monomers (styrene, methacrylic acid, methyl methacrylate) used for the synthesis of the polymer A-1 were changed to the following monomers. The weight-average molecular weight of the polymer A-3 was 40,000.
(1) Benzyl methacrylate (81.0 g)
(2) Methacrylic acid (19.0 g)

<Synthesis of Bifunctional Methacrylate>

Bisphenol A (22.83 g, 0.1 mol), toluene (30 g) as a solvent, and triethylamine (0.3 g) as a catalyst were added to a pressure-resistant reaction container having an internal volume of 500 mL. After replacing the atmosphere in the pressure-resistant reaction container with nitrogen gas, the pressure of the nitrogen gas was adjusted to 0.2 kg/cm$^2$ and was heated to 80° C. while stirring the mixture. The mixture was heated to 150° C. while sequentially introducing ethylene oxide (132.15 g, 3.0 mol) and propylene oxide (23.24 g, 0.4 mol) such that the pressure was maintained at about 2 kg/cm$^2$. The mixture was kept at 150° C. for 1 hour and subsequently was cooled. The mixture was neutralized with oxalic acid, ion exchange water (50 g) was added to the mixture, and the mixture was stirred. Next, the mixture was left to stand, and the separated organic layer was extracted. The obtained organic layer was cleaned three times using ion exchange water (50 g), the pressure was reduced to 30 Torr at 50° C., and the solvent was removed. As a result, divalent alcohol (105.1 g) was obtained. Divalent alcohol (100.0 g, 0.044 mol), methacrylic acid (11.5 g), a 70 mass % methanesulfonic acid aqueous solution (0.9 g), hydroquinone (0.2 g), and toluene (200 mL) were added into a three-neck flask having an internal volume of 1 L. Next, esterification was performed under reflux of toluene for 8 hours. Water produced during the reaction was removed by Dean-Stark trap. After completion of the reaction, the temperature of the mixture was cooled to room temperature, and the obtained organic layer was cleaned once using a 5% sodium hydroxide aqueous solution (50 g) and was cleaned three times using ion exchange water (50 g). Hydroquinone monomethyl ether (0.09 g) was added to the organic layer, the pressure was reduced to 30 Torr at 50° C., and the solvent was removed. Dimethacrylate of polyethylene glycol (90.0 g) where 15 mol of ethylene oxide on average 2 mol of propylene oxide on average were added to both terminals of the bisphenol A, respectively, was obtained.

<Preparation of Negative Tone Photosensitive Resin Composition>

By mixing components selected as shown in Table 1 and then adding methyl ethyl ketone, a negative tone photosensitive resin composition (concentration of solid contents: 25 mass %) was prepared.

TABLE 1

| | Component [Unit of Numerical Value: Part(s) by Mass] | Negative Tone Photosensitive Resin Composition | | | | |
|---|---|---|---|---|---|---|
| | | 1 | 2 | 3 | 4 | 5 |
| Polymer A | PolymerA-1 (Styrene/Methacrylic Acid/Methyl Methacrylate = 32/28/40(Mass Ratio)) | — | 55.00 | — | 62.20 | — |
| | PolymerA-2 (Styrene/Methacrylic Acid/Methyl Methacrylate = 52/29/19(Mass Ratio)) | 50.00 | — | — | — | — |
| | PolymerA-3 (Benzyl Methacrylate/Methyl Methacrylate = 81/19(Mass Ratio)) | — | — | 52.00 | — | 59.20 |

TABLE 1-continued

| Component [Unit of Numerical Value: Part(s) by Mass] | | Negative Tone Photosensitive Resin Composition | | | | |
|---|---|---|---|---|---|---|
| | | 1 | 2 | 3 | 4 | 5 |
| Polymerizable Compound B | BPE-500 (Shin-Nakamura Chemical Co., Ltd.) | 36.20 | 20.20 | 7.40 | — | 27.00 |
| | BPE-200 (Shin-Nakamura Chemical Co., Ltd.) | — | 9.80 | — | 20.00 | — |
| | Bifunctional Methacrylate | — | — | 10.00 | — | — |
| | M-270 (TOAGOSEI CO., LTD.) | 5.00 | — | — | — | — |
| | A-TMPT (Shin-Nakamura Chemical Co., Ltd.) | — | 10.00 | 10.00 | 6.00 | — |
| | SR-454 (ARKEMA K.K.) | — | — | 15.00 | 9.00 | — |
| | SR-502 (ARKEMA K.K.) | — | — | — | — | 4.00 |
| | A-9300-CL1 (Shin-Nakamura Chemical Co., Ltd.) | — | — | — | — | 7.80 |
| Photopolymerization Initiator | B-CIM (KUROGANE KASEI Co., Ltd.) | 7.00 | 3.00 | 3.80 | 1.90 | 1.10 |
| Sensitizer | SB-PI 701 (Sanyo Trading Co.,Ltd.) | 0.50 | 0.50 | 0.30 | 0.30 | 0.10 |
| Chain Transfer Agent | Leuco Crystal Violet (Tokyo Chemical Industry Co., Ltd.) | 0.40 | 0.90 | — | 0.40 | 0.66 |
| | N-phenylglycine (Tokyo Chemical Industry Co., Ltd.) | 0.20 | — | 1.00 | — | — |
| Coloring Agent (Colorant) | Brilliant Green (Tokyo Chemical Industry Co., Ltd.) | — | 0.05 | 0.05 | 0.05 | — |
| Rust Inhibitor | CBT-1 (JOHOKU CHEMICAL CO., LTD) | 0.10 | — | 0.05 | 0.03 | 0.03 |
| | Mixture of Two Benzotriazole Compounds | — | 0.14 | 0.05 | — | — |
| Polymerization Inhibitor | TDP-G (Kawaguchi Chemical Industry Co., Ltd.) | 0.30 | 0.10 | — | — | — |
| | Irganox245 (BASF SE) | — | — | 0.20 | 0.10 | 0.10 |
| | N-Nitrosophenylhydroxylamine Aluminium Salt (FUJIFILM Wako Pure Chemical Corporation) | — | — | 0.01 | 0.02 | 0.01 |
| Antioxidant | Phenidone (Tokyo Chemical Industry Co., Ltd.) | 0.01 | 0.01 | 0.01 | — | — |
| Surfactant | F-552 (DIC Corporation) | 0.29 | 0.30 | 0.13 | — | — |

In Table 1, "-" represents that the amount used is 0 parts by mass.

In Table 1, "bifunctional methacrylate" represents dimethacrylate of polyethylene glycol where 15 mol of ethylene oxide on average 2 mol of propylene oxide on average were added to both terminals of the bisphenol A, respectively.

In Table 1, "B-CIM" represents 2,2'-bis(2-chlorophenyl)-4,4',5,5'-tetraphenyl-1,2'-biimidazole.

In Table 1, "Mixture of Two Benzotriazole Compounds" represents a mixture of 1-(2-di-n-butylaminomethyl)-5-carboxylbenzotriazole and 1-(2-di-n-butylaminomethyl)-6-carboxylbenzotriazole. A mass ratio between 1-(2-di-n-butylaminomethyl)-5-carboxylbenzotriazole and 1-(2-di-n-butylaminomethyl)-6-carboxylbenzotriazole was 1:1.

<Example 1>

[Preparation of Photosensitive Transfer Material]

As a temporary support, a polyethylene terephthalate (PET) film (LUMIRROR 16KS40, manufactured by Toray industries Inc., thickness: 16 μm, arithmetic average roughness Ra: 0.02 μm) was prepared. The negative tone photosensitive resin composition was applied to a surface of the temporary support using a slit-shaped nozzle such that the application width was 1.0 m and the thickness after drying was a value shown in Table 2. The kind of the negative tone photosensitive resin composition was selected as shown in Table 2. By drying the formed coating film of the negative tone photosensitive resin composition at 90° for 100 seconds, the negative tone photosensitive resin layer was formed. By pressure bonding a polyethylene film (GF-818, manufactured by Tamapoly Co., Ltd., thickness: 19 μm) as a cover film to the surface of the formed negative tone photosensitive resin layer, a photosensitive transfer material was prepared. By winding the obtained photosensitive transfer material, the photosensitive transfer material in the form of a roll was prepared.

[Formation of Light Shielding Pattern (Copper Pattern)]

By forming a copper layer having a thickness of 200 nm on a polyethylene terephthalate (PET) film having a thickness of 100 μm by sputtering, the PET film with the copper layer was prepared. After peeling off the cover film from the photosensitive transfer material, the photosensitive transfer material was bonded to the PET film with the copper layer. The bonding step was performed under conditions of roll temperature: 100° C., linear pressure: 1.0 MPa, and linear velocity: 1.0 m/min. Next, the negative tone photosensitive resin layer was exposed by being irradiated with light using a high-pressure mercury lamp exposure device (MAP-1200L, manufactured by Japan Science Engineering Co., Ltd., dominant wavelength: 365 nm) through a photomask. After peeling off the temporary support, the negative tone photosensitive resin layer was developed by showering using a sodium carbonate aqueous solution having a liquid temperature of 25° C. for 30 seconds. As a result, a resin pattern (line/space=5.5 μm/4.5 μm) was formed. The copper layer that was not covered with the resin pattern was etched using an etchant (Cu-02, manufactured by Kanto Chemical Co., Inc.). The remaining resin pattern was removed using a stripper (10 mass % sodium hydroxide aqueous solution). Through the above-described procedure, the PET film with the copper pattern (line/space=5 μm/5 μm) was prepared. The copper pattern functions as the light shielding pattern. The average thickness of the copper pattern is shown in Table 2.

[Formation of Conductive Pattern (Copper Pattern)]

After peeling off the cover film from the photosensitive transfer material, the photosensitive transfer material 1 was bonded to the PET film with the copper pattern. The bonding step was performed under conditions of roll temperature: 100° C., linear pressure: 1.0 MPa, and linear velocity: 1.0 m/min The obtained laminate includes the PET film, the copper pattern (light shielding pattern), the negative tone photosensitive resin layer, and the temporary support in this order. A surface of the PET film opposite to a surface facing the copper pattern (light shielding pattern) was irradiated with light using a high-pressure mercury lamp exposure device (MAP-1200L, manufactured by Japan Science Engineering Co., Ltd., dominant wavelength: 365 nm). The exposure amount is shown in Table 2. After peeling off the temporary support, the photosensitive resin layer was developed by showering using a sodium carbonate aqueous solution having a liquid temperature of 25° C. for 30 seconds. As a result, a resin pattern was formed. The space portion (that is, the groove) of the copper pattern (light shielding pattern) was filled with the resin pattern. The average thickness of the resin pattern is shown in Table 2. Copper was deposited on the copper pattern (light shielding pattern) that was not covered with the resin pattern by electrolytic copper plating. The current density in the electrolytic copper plating was 1.8 ASD. The treatment time in the electrolytic copper plating was 6 minutes. The PET film after the electrolytic copper plating was heated at 130° C. for 30 minutes. Through the above-described procedure, a structure including the copper pattern (line/space=5 μm/5 μm) was prepared. The average thickness of the copper pattern (conductive pattern) deposited by the electrolytic copper plating is shown in Table 2.

<Examples 2 to 6>

Structures having the copper pattern were prepared through the same procedure as that of Example 1, except that the kind of the photosensitive transfer material, the average thickness of the light shielding pattern (copper pattern), and the average thickness of the conductive pattern (copper pattern) deposited by the electrolytic copper plating were appropriately changed as shown in Table 2. The average thickness of copper deposited by the electrolytic copper plating can be increased by extending the treatment time.

<Comparative Example 1>

A structure having the copper pattern was prepared through the same procedure as that of Example 1, except that the light irradiation method in the steps described in "Formation of Conductive Pattern (Copper Pattern)" was changed. Specifically, in the laminate including the PET film, the copper pattern (light shielding pattern), the negative tone photosensitive resin layer, and the temporary support in this order, a surface of the temporary support opposite to a surface where the negative tone photosensitive resin layer was disposed was brought into contact with a photomask, and the negative tone photosensitive resin layer was irradiated with light through the photomask. However, in the step of irradiating light, misregistration of the copper pattern (light shielding pattern) that was presumed to occur by contraction of the PET film was observed. Therefore, it was difficult to perform registration between the position of an opening portion of the photomask and the space portion of the copper pattern (light shielding pattern). As a result, the resin pattern was not able to be formed on the space portion of the copper pattern (light shielding pattern).

<Evaluation>

[Formability of Conductive Pattern]

Using an optical microscope, any 100 visual fields of the structure having the conductive pattern were observed. The range of each of the visual fields was 200 μm ×200 μm. The formability of the conductive pattern was evaluated according to the following standards based on the number of visual fields where an abnormal portion was observed in the conductive pattern. The abnormal portion refers to a portion where form abnormality such as breakage, peeling, or chipping was observed in the conductive pattern. The evaluation results are shown in Table 2.

A: the number of visual fields where an abnormal portion was observed was less than 20

B: the number of visual fields where an abnormal portion was observed was 20 or more.

[Incorporation of Bubbles in Bonding Step]

The PET film with the copper pattern prepared in each of Examples and the photosensitive transfer material used in each of Examples were bonded under the following conditions. Specifically, the PET film with the copper pattern and the photosensitive transfer material were bonded under conditions of roll temperature: 100° C. and linear pressure: 1.0 MPa while changing the linear velocity from 1.0 m/min to 5.0 m/min. The number of bubbles incorporated into a region surrounded by the level difference (light shielding pattern) of the obtained laminate was observed using an optical microscope. The degree of the incorporation of bubbles in the bonding step was evaluated based on the following standards. The following standard is one index representing the productivity of the bonding step.

A: bubbles were not observed under any condition of linear velocity: 1.0 m/min or linear velocity: 5.0 m/min B: bubbles were not observed at a linear velocity of 1.0 m/min, but bubbles were incorporated at a linear velocity of 5.0 m/min.

TABLE 2

| | Photosensitive Transfer Material | | | | | | Evaluation | |
|---|---|---|---|---|---|---|---|---|
| | Kind of Negative Tone Photosensitive Resin Composition Kind | Average Thickness of Negative Tone Photosensitive Resin Layer [μm] | Exposure Amount [mJ/cm2] | Average Thickness of Light Shielding Pattern [μm] | Average Thickness of Resin Pattern [μm] | Average Thickness of Conductive Pattern [μm] | Formability of Conductive Pattern | Incorporation of Bubbles in Bonding Step |
| Example 1 | 1 | 1 | 3 | 70 | 2 | 3 | 2 | A | B |
| Example 2 | 1 | 1 | 3 | 70 | 1 | 3 | 2 | A | A |
| Example 3 | 2 | 2 | 3 | 70 | 1 | 3 | 2 | A | A |
| Example 4 | 3 | 3 | 5 | 70 | 1 | 5 | 4 | A | A |

TABLE 2-continued

| | | Photosensitive Transfer Material | | | | | | Evaluation | |
|---|---|---|---|---|---|---|---|---|---|
| | Kind | Kind of Negative Tone Photosensitive Resin Composition | Average Thickness of Negative Tone Photosensitive Resin Layer [μm] | Exposure Amount [mJ/cm2] | Average Thickness of Light Shielding Pattern [μm] | Average Thickness of Resin Pattern [μm] | Average Thickness of Conductive Pattern [μm] | Formability of Conductive Pattern | Incorporation of Bubbles in Bonding Step |
| Example 5 | 4 | 4 | 10 | 80 | 1 | 10 | 9 | A | A |
| Example 6 | 5 | 5 | 3 | 70 | 0.5 | 3 | 2 | A | A |

The results shown in Table 2 show that, in Examples 1 to 6, the thick conductive pattern where the occurrence of form abnormality was reduced was formed.

The disclosure of Japanese Patent Application No. 2020-034129 filed on Feb. 28, 2020 is incorporated herein in its entirety. All publications, patent applications, and technical standards mentioned in the present specification are herein incorporated by reference to the same extent as if each individual publication, patent application, or technical standard was specifically and individually indicated to be incorporated by reference.

EXPLANATION OF REFERENCES 10, 11, 12: transparent substrate
10a: exposed surface
20, 21: light shielding pattern
30: negative tone photosensitive resin layer
30a: exposed portion
40, 41, 42: resin pattern
50, 51: conductive pattern
100: laminate
200, 210: structure

What is claimed is:

1. A method of manufacturing a conductive pattern, the method comprising:
    preparing a laminate including a transparent substrate, a light shielding pattern that is formed on the transparent substrate, and a negative tone photosensitive resin layer that is disposed on the transparent substrate and the light shielding pattern and is in contact with the transparent substrate;
    irradiating a surface of the transparent substrate opposite to a surface facing the light shielding pattern with light;
    developing the negative tone photosensitive resin layer to form a resin pattern having an average thickness of 10 μm or more in a region defined by the transparent substrate and the light shielding pattern; and
    forming a conductive pattern on the light shielding pattern, wherein:
    the preparing the laminate includes forming the negative tone photosensitive resin layer on the transparent substrate and the light shielding pattern, in a laminate precursor including the transparent substrate and the light shielding pattern that is formed on the transparent substrate, using a photosensitive transfer material including the negative tone photosensitive resin layer and a temporary support having an average thickness of 5 μm to 50 μm;
    the negative tone photosensitive resin layer includes an alkali-soluble polymer, a compound having an ethylenically unsaturated bond, a photopolymerization initiator, a sensitizer, and a chain transfer agent;
    the compound having an ethylenically unsaturated bond includes a bifunctional ethylenically unsaturated compound having a bisphenol A structure; and
    the photopolymerization initiator includes at least one selected from the group consisting of 2,4,5-triarylimidazole dimer and a derivative of 2,4,5-triarylimidazole dimer.

2. The method of manufacturing a conductive pattern according to claim 1,
    wherein in forming the conductive pattern, the conductive pattern is formed by plating.

3. The method of manufacturing a conductive pattern according to claim 1,
    wherein the light shielding pattern is conductive.

4. The method of manufacturing a conductive pattern according to claim 1,
    wherein an average thickness of the light shielding pattern is 2 μm or less.

5. The method of manufacturing a conductive pattern according to claim 1, further comprising:
    removing the resin pattern after forming the conductive pattern.

6. The method of manufacturing a conductive pattern according to claim 1,
    wherein the average thickness of the resin pattern is more than an average thickness of the light shielding pattern.

7. The method of manufacturing a conductive pattern according to claim 1,
    wherein an average width of the light shielding pattern is 5 μm or less.

8. The method of manufacturing a conductive pattern according to claim 1,
    wherein the light has a wavelength of 365 nm.

9. The method of manufacturing a conductive pattern according to claim 1,
    wherein the alkali-soluble polymer is a random copolymer.

* * * * *